United States Patent
Kang et al.

(10) Patent No.: US 10,894,935 B2
(45) Date of Patent: Jan. 19, 2021

(54) COMPOSITION FOR REMOVING SILICONE RESINS AND METHOD OF THINNING SUBSTRATE BY USING THE SAME

(71) Applicants: SAMSUNG ELECTRONICS CO., LTD., Suwon-si (KR); Dongwoo Fine-Chem Co., Ltd., Iksan-si (KR)

(72) Inventors: In-goo Kang, Hwaseong-si (KR); Sung-bae Kim, Seongnam-si (KR); Baik-soon Choi, Anyang-si (KR); Sue-ryeon Kim, Hwaseong-si (KR); Young-taek Hong, Hwaseong-si (KR); Sang-tae Kim, Iksan-si (KR); Kyong-ho Lee, Osan-si (KR); Hyung-pyo Hong, Seongnam-si (KR); Seong-min Kim, Iksan-si (KR)

(73) Assignees: SAMSUNG ELECTRONICS CO., LTD., Suwon-si (KR); DONGWOO FINE-CHEM CO., LTD., Iksan-si (KR)

( * ) Notice: Subject to any disclaimer, the term of this patent is extended or adjusted under 35 U.S.C. 154(b) by 76 days.

(21) Appl. No.: 15/984,050

(22) Filed: May 18, 2018

(65) Prior Publication Data
US 2018/0265819 A1 Sep. 20, 2018

Related U.S. Application Data

(63) Continuation-in-part of application No. 15/369,859, filed on Dec. 5, 2016, now abandoned.

(30) Foreign Application Priority Data

Dec. 4, 2015 (KR) .................. 10-2015-0172656

(51) Int. Cl.
*C11D 1/00* (2006.01)
*C11D 3/28* (2006.01)
(Continued)

(52) U.S. Cl.
CPC .............. *C11D 7/5013* (2013.01); *C11D 1/00* (2013.01); *C11D 3/0073* (2013.01);
(Continued)

(58) Field of Classification Search
CPC ....... C11D 1/00; C11D 3/0073; C11D 3/2096; C11D 3/28; C11D 3/30; C11D 3/245; C11D 3/43; H01L 21/304; H01L 21/6836
(Continued)

(56) References Cited

U.S. PATENT DOCUMENTS 6,652,665 B1  11/2003  Sachdev et al.
6,656,894 B2  12/2003  Peters et al.
(Continued)

FOREIGN PATENT DOCUMENTS

CN  1185231 A  6/1998
CN  1479780 A  3/2004
(Continued)

OTHER PUBLICATIONS

Office Action dated Jan. 18, 2018 by the U.S. Patent and Trademark Office in parent U.S. Appl. No. 15/369,859.
(Continued)

*Primary Examiner* — Gregory R Delcotto
(74) *Attorney, Agent, or Firm* — Sughrue Mion, PLLC

(57) ABSTRACT

Compositions for removing silicone resins and methods of thinning a substrate by using the same, as well as related methods, apparatus and systems for facilitating the removal of silicone resins are provided. The compositions for removing silicone resins, may include a heterocyclic solvent and an alkyl ammonium fluoride salt represented by a formula, $(R)_4N^+F^-$, wherein R is a C1 to C4 linear alkyl group. Silicone resins may be effectively removed by using the compositions since the compositions exhibit an excellent decomposition rate with respect to the silicone resins that
(Continued)

remain on a semiconductor substrate in a process of backside grinding of the semiconductor substrate, backside electrode formation, or the like.

20 Claims, 31 Drawing Sheets

(51) Int. Cl.

| | | |
|---|---|---|
| C11D 3/20 | (2006.01) | |
| C11D 3/30 | (2006.01) | |
| C11D 7/50 | (2006.01) | |
| H01L 21/683 | (2006.01) | |
| H01L 21/02 | (2006.01) | |
| C11D 7/32 | (2006.01) | |
| C11D 11/00 | (2006.01) | |
| H01L 21/311 | (2006.01) | |
| H01L 21/768 | (2006.01) | |
| C11D 3/00 | (2006.01) | |
| H01L 21/304 | (2006.01) | |
| C11D 3/43 | (2006.01) | |
| C11D 3/24 | (2006.01) | |
| C09J 183/04 | (2006.01) | |
| B32B 43/00 | (2006.01) | |
| H01L 21/67 | (2006.01) | |
| H01L 25/065 | (2006.01) | |
| H01L 23/00 | (2006.01) | |
| B32B 38/10 | (2006.01) | |
| C11D 7/26 | (2006.01) | |

(52) U.S. Cl.
CPC ............ *C11D 3/2096* (2013.01); *C11D 3/245* (2013.01); *C11D 3/28* (2013.01); *C11D 3/30* (2013.01); *C11D 3/43* (2013.01); *C11D 7/3209* (2013.01); *C11D 11/0047* (2013.01); *H01L 21/02057* (2013.01); *H01L 21/304* (2013.01); *H01L 21/31133* (2013.01); *H01L 21/6835* (2013.01); *H01L 21/76898* (2013.01); *B32B 38/10* (2013.01); *B32B 43/006* (2013.01); *B32B 2457/14* (2013.01); *C09J 183/04* (2013.01); *C11D 7/267* (2013.01); *C11D 7/3281* (2013.01); *H01L 21/67051* (2013.01); *H01L 24/05* (2013.01); *H01L 24/13* (2013.01); *H01L 24/16* (2013.01); *H01L 25/0657* (2013.01); *H01L 2221/6834* (2013.01); *H01L 2221/68318* (2013.01); *H01L 2221/68327* (2013.01); *H01L 2221/68381* (2013.01); *H01L 2224/0401* (2013.01); *H01L 2224/0557* (2013.01); *H01L 2224/13023* (2013.01); *H01L 2224/13025* (2013.01); *H01L 2224/13111* (2013.01); *H01L 2224/16145* (2013.01); *H01L 2224/16225* (2013.01); *H01L 2225/06541* (2013.01); *H01L 2225/06586* (2013.01); *H01L 2924/15311* (2013.01); *H01L 2924/181* (2013.01)

(58) Field of Classification Search
USPC ................ 510/175, 176, 499, 500; 257/737; 438/759
See application file for complete search history.

(56) References Cited

U.S. PATENT DOCUMENTS

| | | |
|---|---|---|
| 7,531,495 B2 | 5/2009 | Kabashima et al. |
| 8,529,703 B2 | 9/2013 | Kabashima et al. |
| 9,023,716 B2 | 5/2015 | Lee et al. |
| 9,029,269 B2 | 5/2015 | Bourbina et al. |
| 9,412,636 B2 | 8/2016 | Lee et al. |
| 2003/0168079 A1 | 9/2003 | Kabashima et al. |
| 2006/0014656 A1 | 1/2006 | Egbe et al. |
| 2006/0063688 A1 | 3/2006 | Yokoi et al. |
| 2006/0122085 A1 | 6/2006 | Korzenski et al. |
| 2006/0199749 A1 | 9/2006 | Suzuki et al. |
| 2007/0037400 A1 | 2/2007 | Hwang et al. |
| 2007/0135321 A1 | 6/2007 | Patel et al. |
| 2008/0006305 A1 | 1/2008 | Bernhard et al. |
| 2008/0039356 A1 | 2/2008 | Palmer et al. |
| 2009/0099051 A1 | 4/2009 | Aoyama et al. |
| 2010/0197136 A1 | 8/2010 | Shimada et al. |
| 2011/0015108 A1 | 1/2011 | Rovito et al. |
| 2011/0180747 A1 | 7/2011 | Lee |
| 2011/0311921 A1 | 12/2011 | Egbe et al. |
| 2012/0048295 A1 | 3/2012 | Du et al. |
| 2012/0273010 A1 | 11/2012 | Duong |
| 2013/0023109 A1 | 1/2013 | Harkness |
| 2013/0035272 A1 | 2/2013 | Lee et al. |
| 2013/0126470 A1 | 5/2013 | Shirai et al. |
| 2014/0210075 A1* | 7/2014 | Lee .................. H01L 24/14 257/737 |
| 2014/0213039 A1 | 7/2014 | Lee et al. |
| 2014/0336093 A1 | 11/2014 | Koellnberger |
| 2014/0357052 A1 | 12/2014 | Ueno et al. |
| 2015/0152362 A1 | 6/2015 | Hulse et al. |
| 2015/0214089 A1 | 7/2015 | Lee et al. |
| 2015/0315712 A1 | 11/2015 | Hawes |

FOREIGN PATENT DOCUMENTS

| | | |
|---|---|---|
| CN | 101857825 A | 10/2010 |
| CN | 102420157 A | 4/2012 |
| CN | 102753636 A | 10/2012 |
| JP | 4267911 B2 | 5/2009 |
| JP | 20157217 A | 1/2015 |
| KR | 100537575 B1 | 12/2005 |
| KR | 20140060389 A | 5/2014 |
| KR | 101416103 B1 | 7/2014 |
| KR | 20140095822 A | 8/2014 |
| KR | 20140095824 A | 8/2014 |
| KR | 20140096362 A | 8/2014 |
| KR | 20150047856 A | 5/2015 |

OTHER PUBLICATIONS

Office Action dated Aug. 9, 2017 by the U.S. Patent and Trademark Office in parent U.S. Appl. No. 15/369,859.
Communication dated Dec. 2, 2019 issued by the State Intellectual Property Office of P.R. China in counterpart Chinese Application No. 201611111478.7.

* cited by examiner

COMPOSITION FOR REMOVING SILICONE RESINS AND METHOD OF THINNING SUBSTRATE BY USING THE SAME

CROSS-REFERENCE TO RELATED APPLICATION

This is a continuation-in-part of U.S. application Ser. No. 15/369,859 filed on Dec. 5, 2016, which claims the benefit of Korean Patent Application No. 10-2015-0172656, filed on Dec. 4, 2015, in the Korean Intellectual Property Office, the disclosures of which are incorporated herein in their entirety by reference.

TECHNICAL FIELD

The present disclosure relates to compositions for removing silicone resins and to methods of thinning a substrate using the same, and more particularly, to compositions for removing silicone resins whereby silicone resins remaining on a semiconductor substrate may be effectively removed, and a method of thinning a substrate using the same.

BACKGROUND

In a fabrication process of a semiconductor device, after an electronic circuit is formed on a surface of a semiconductor substrate, a thinning process may be performed in some cases in order to reduce a thickness of the semiconductor substrate. In these cases, to protect a circuit surface of the semiconductor substrate and to sufficiently fix the semiconductor substrate, the semiconductor substrate is attached to a carrier substrate by using a silicone resin. After completion of the thinning process, the silicone resin may remain on an active surface of the semiconductor substrate when the carrier substrate is separated from the semiconductor substrate. There is a need for compositions and methods for effectively removing the residual silicone resin and a need for methods for thinning substrates using the compositions.

SUMMARY

The present disclosure provides compositions for removing silicone resins, whereby silicone resins remaining on a semiconductor substrate may be effectively removed.

The present disclosure also provides methods of thinning a substrate, whereby silicone resins remaining on a semiconductor substrate may be effectively removed.

The present disclosure also provides methods of fabricating a semiconductor package using one of the compositions for removing silicone resins.

According to an aspect of the present disclosure, there is provided a composition for removing silicone resins, the composition including a heterocyclic solvent and an alkyl ammonium fluoride salt represented by Formula (1):

$(R)_4N^+F^-$                                                             Formula (1)

wherein R is a C3 or C4 linear alkyl group.

The heterocyclic solvent may be a nitrogen-containing or oxygen-containing heterocyclic solvent. The heterocyclic solvent may, for example, have a 4- to 8-membered ring. Specifically, the heterocyclic solvent may include at least one selected from the group consisting of a pyridine solvent, a morpholine solvent, a piperazine solvent, a pyrrolidone solvent, a urea solvent, and an oxazolidinone solvent.

According to another aspect of the present disclosure, there is provided a method of thinning a substrate, the method including: attaching a carrier substrate to a target substrate intended to be thinned by using a silicone binder; thinning the target substrate; separating the carrier substrate and the target substrate from each other; and, cleaning the target substrate by using a composition for removing silicone resins in order to remove the silicone binder remaining on the target substrate. Here, the composition for removing silicone resins includes a nitrogen-containing heterocyclic solvent and a fluorine-containing compound.

According to a further aspect of the present disclosure, there is provided a method of fabricating a semiconductor package, the method including: providing a semiconductor substrate which includes a semiconductor device formed on an active surface of the substrate and a through-electrode electrically connected to the semiconductor device, the through-electrode extending toward a surface of the substrate opposite the active surface; bonding a carrier substrate to the active surface of the semiconductor substrate via an intervening layer of the silicone binder; thinning the surface opposite the active surface such that the through-electrode is exposed; separating the semiconductor substrate from the carrier substrate; and, bringing the semiconductor substrate into contact with a composition for removing silicone resins in order to remove residues of the silicone binder remaining on the active surface of the semiconductor substrate, wherein the composition for removing silicone resins includes a heterocyclic solvent and an alkyl ammonium fluoride salt represented by Formula (1).

According to yet another aspect of the present disclosure, a composition is provided for removing silicone resins that may include: about 70 wt % to about 99.9 wt % of a nitrogen-containing heterocyclic solvent; and about 0.1 wt % to about 30 wt % of an alkyl ammonium fluoride salt, based on the total weight of the composition.

In some embodiments, a system is provided for temporarily bonding a target substrate to a carrier substrate to facilitate processing of the target substrate. The system includes a carrier substrate; a silicone binder configured to bond the carrier substrate to the target substrate; a separation apparatus configured to separate the carrier substrate and the target substrate from one another such that a residue of the silicone binder remains on the target substrate; and a composition configured to remove the residue, wherein the composition comprises a heterocyclic solvent and an alkyl ammonium fluoride salt represented by Formula (1):

$(R)_4N^+F^-$                                                         Formula (1)

wherein R is a C3 or C4 linear alkyl group.

BRIEF DESCRIPTION OF THE DRAWINGS

Embodiments of the compositions, methods, and systems will be more clearly understood from the following detailed description taken in conjunction with the accompanying drawings as listed below.

DETAILED DESCRIPTION OF THE EMBODIMENTS

Figure 1:
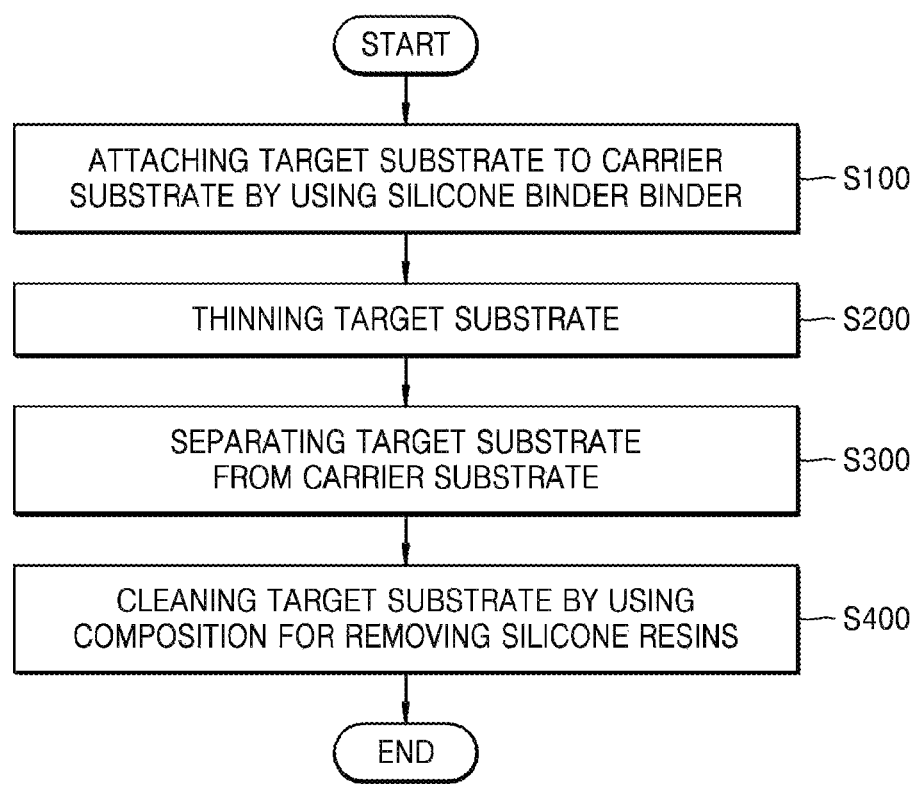
FIG. 1 is a flowchart of a method of thinning a substrate by using a composition for removing silicone resins according to an embodiment, the flowchart showing the order of performing the method.

According to an embodiment, a composition for removing silicone resins may include a heterocyclic solvent and an alkyl ammonium fluoride salt.

The alkyl ammonium fluoride salt may have, for example, a structure represented by Formula (1):

$$(R)_4N^+F^-$$ Formula (1)

wherein R is a C1 to C4 linear alkyl group.

The compound represented by Formula (1) may include at least one selected from the group consisting of tetramethylammonium fluoride, tetraethylammonium fluoride, and tetrabutylammonium fluoride. A single type of alkyl ammonium fluoride salt such as tetrabutylammonium fluoride may be used or multiple types may be used in combination.

In some embodiments, R in Formula (1) may be a C3 or C4 linear alkyl group. When R is a C3 or C4 linear alkyl group, the alkyl ammonium fluoride salt may have an improved storage stability.

The heterocyclic solvent may be a cyclic compound including at least one hetero-element in a ring. In some embodiments, the at least one hetero-element included in the heterocyclic solvent may be nitrogen or oxygen. In some embodiments, the ring of the heterocyclic solvent may be a 4- to 8-membered ring.

The heterocyclic solvent may include at least one selected from the group consisting of a pyridine solvent, a morpholine solvent, a piperazine solvent, a pyrrolidone solvent, a urea solvent, and an oxazolidinone solvent. However, the inventive concept is not limited thereto.

In some embodiments, the heterocyclic solvent may be an aprotic solvent.

The pyridine solvent may have a structure represented by Formula (2):

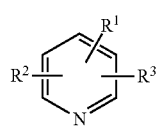

Formula (2)

wherein each of $R^1$, $R^2$, and $R^3$ may be hydrogen, a halogen element, a C1 to C22 branched or non-branched alkyl group, a C1 to C10 alkoxy group, a C2 to C22 branched or non-branched alkenyl group, a C1 to C20 alkylamino group, a C6 to C20 aryl or alkylaryl group, a C7 to C20 arylalkyl group, a C5 to C12 cycloalkyl group, an aldehyde group, an acetaldehyde group, a cyanide group, or a methyl sulfide group.

The pyridine solvent may include, for example, at least one selected from the group consisting of pyridine, 2-methylpyridine, 3-methylpyridine, 4-methylpyridine, 4-ethylpyridine, 4-propylpyridine, 4-isopropylpyridine, 4-amylpyridine, 2,3-lutidine, 2,4-lutidine, 2,5-lutidine, 3,4-lutidine, 3,5-lutidine, and 2,4,6-trimethylpyridine. However, the inventive concept is not limited thereto.

The morpholine solvent may have a structure represented by Formula (3):

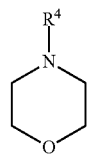

Formula (3)

wherein $R^4$ may be hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group. Optionally, $R^4$ may be a phenyl group substituted with a C1 to C4 aliphatic hydrocarbon, a halogen element, a cyanide group, or an aldehyde group. Optionally, $R^4$ may be a pyridine group substituted with a C1 to C4 aliphatic hydrocarbon, a halogen element, a cyanide group, or an aldehyde group.

The piperazine solvent may have a structure represented by Formula (4):

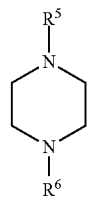

Formula (4)

wherein each of $R^5$ and $R^6$ may be hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group. Optionally, $R^5$ or $R^6$ may be a phenyl group substituted with a C1 to C4 aliphatic hydrocarbon, a halogen element, a cyanide group, or an aldehyde group. Optionally, $R^5$ or $R^6$ may be a pyridine group substituted with a C1 to C4 aliphatic hydrocarbon, a halogen element, a cyanide group, or an aldehyde group.

The pyrrolidone solvent may have a structure represented by Formula (5):

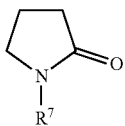

Formula (5)

wherein R⁷ may be hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group. Optionally, R⁷ may be a phenyl group substituted with a C1 to C4 aliphatic hydrocarbon, a halogen element, a cyanide group, or an aldehyde group. Optionally, R⁷ may be a pyridine group substituted with a C1 to C4 aliphatic hydrocarbon, a halogen element, a cyanide group, or an aldehyde group.

The pyrrolidone solvent may include, for example, at least one selected from the group consisting of N-methylpyrrolidone (NMP), N-ethylpyrrolidone (NEP), 2-pyrrolidone, and N-vinylpyrrolidone (NVP). However, the inventive concept is not limited thereto.

The urea solvent may have a structure represented by Formula (6):

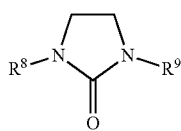

Formula (6)

wherein each of R⁸ and R⁹ may be hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group. Optionally, R⁸ or R⁹ may be a pyridine group substituted with a C1 to C4 aliphatic hydrocarbon, a halogen element, a cyanide group, or an aldehyde group.

The oxazolidinone solvent may have a structure represented by Formula (7):

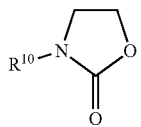

Formula (7)

wherein R¹⁰ may be hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group. Optionally, R¹⁰ may be a phenyl group substituted with a C1 to C4 aliphatic hydrocarbon, a halogen element, a cyanide group, or an aldehyde group. Optionally, R¹⁰ may be a pyridine group substituted with a C1 to C4 aliphatic hydrocarbon, a halogen element, a cyanide group, or an aldehyde group.

In some embodiments, the composition for removing silicone resins may not include a protic solvent. In some embodiments, the composition for removing silicone resins may include a protic solvent in an amount less than 10 wt %, 7 wt %, 5 wt %, 4 wt %, 3 wt %, 2 wt %, 1 wt %, or 0.5 wt % of the composition. The protic solvent may be at least one of water and alcohol.

In the composition for removing silicone resins, the alkyl ammonium fluoride salt may be present in an amount of about 0.1 wt % to about 30 wt % based on the total weight of the composition. In one embodiment, the amount of the alkyl ammonium fluoride salt may range from about 1 wt % to about 20 wt %. If the amount of the alkyl ammonium fluoride salt is too high, the water content of the composition may increase over time, and there is a concern that the composition may exhibit deteriorated performance in removing silicone resins, and metals on a circuit surface of a substrate exposed to the composition may suffer from corrosion. On the other hand, if the amount of the alkyl ammonium fluoride salt is too low, the composition may not effectively remove silicone resins. These factors are balanced by use of the alkyl ammonium fluoride salt in an amount of about 0.1 wt % to about 30 wt % based on the total weight of the composition.

In the composition for removing silicone resins, the heterocyclic solvent may be present in an amount of about 70 wt % to about 99.9 wt % based on the total weight of the composition. In some embodiments, the amount of the heterocyclic solvent may range from about 80 wt % to about 99 wt %, from about 90 wt % to about 99 wt %, from about 90 wt % to about 97 wt %, or from about 94 wt % to about 97 wt %. However, if the amount of the heterocyclic solvent is too high, the composition may not effectively remove silicone resins attached to electronic parts. On the other hand, if the amount of the heterocyclic solvent is too low, metals on a circuit surface of a substrate may suffer from corrosion. These factors are balanced by use of the heterocyclic solvent in an amount of about 70 wt % to about 99.9 wt % based on the total weight of the composition. In some embodiments, the amount of the heterocyclic solvent, which is not a protic solvent, may be about 70 wt % to about 99.9 wt %, about 80 wt % to about 99 wt %, about 90 wt % to about 99 wt %, about 90 wt % to about 97 wt %, about 94 wt % to about 97 wt % based on the total weight of the composition.

In some embodiments, the composition for removing silicone resins may further include a corrosion inhibitor. In the composition for removing silicone resins, the corrosion inhibitor may be present in an amount of about 0.01 wt % to about 6 wt % based on the total weight of the composition. Examples of a suitable corrosion inhibitor may specifically include: azole compounds such as benzotriazole, tolytriazole, methyl tolytriazole, 2,2'-[[[benzotriazole]methyl]imino]bisethanol, 2,2'-[[[methyl-1H-benzotriazol-1-yl]methyl]imino]bismethanol, 2,2'-[[[ethyl-1H-benzotriazol-1-yl]methyl]imino]bisethanol, 2,2'-[[[methyl-1H-benzotriazol-1-yl]methyl]imino]bisethanol, 2,2'-[[[methyl-1H-benzotriazol-1-yl]methyl]imino]biscarboxylic acid, 2,2'-[[[methyl-1H-benzotriazol-1-yl]methyl]imino]bismethylamine, and 2,2'-[[[amine-1H-benzotriazol-1-yl]methyl]imino]bisethanol; quinone compounds such as 1,2-benzoquinone, 1,4-benzoquinone, 1,4-naphthoquinone, and anthraquinone; alkyl gallates such as catechol, pyrogallol, methyl gallate, propyl gallate, dodecyl gallate, octyl gallate, and gallic acid; organic acid amide esters such as succinic amide ester, malic amide ester, maleic amide ester, fumaric amide ester, oxalic amide ester, malonic amide ester, glutaric amide ester, acetic amide ester, lactic amid ester, citric amide ester, tartaric amide ester, glycolic amide ester, formic amide ester, and uric amide ester, and the like. These compounds may be used alone or in combination.

In some embodiments, the composition for removing silicone resins may further include a surfactant. The surfactant may be one or more of a nonionic surfactant, cationic surfactant, anionic surfactant, amphoteric surfactants, or the like or any combination thereof. In the composition for removing silicone resins, the surfactant may be present in an amount of about 0.01 wt % to about 1 wt % based on the total weight of the composition.

Examples of a suitable nonionic surfactant may include: polyoxyethylene alkyl ethers such as polyoxyethylene lauryl ether, and polyoxyethylene stearyl ether; polyoxyethylene alkyl phenyl ethers such as polyoxyethylene octyl phenyl ether, and polyoxyethylene nonyl phenyl ether; sorbitan higher fatty acid esters such as sorbitan monolaurate, sorbitan monostearate, and sorbitan trioleate; polyoxyethylene sorbitan higher fatty acid esters such as polyoxyethylene sorbitan monolaurate; polyoxyethylene higher fatty acid esters such as polyoxyethylene monostearate, and polyoxyethylene monostearate; glycerin higher fatty acid esters such as oleic acid monoglyceride, and stearic acid monoglyceride; polyoxyalkylenes such as polyoxyethylene, polyoxypropylene, and polyoxybutylene; and block copolymers thereof.

Examples of a suitable cationic surfactant may include alkyl trimethyl ammonium chloride, dialkyl dimethyl ammonium chloride, benzalkonium chloride salt, alkyl dimethyl ammonium ethosulfate, and the like.

Examples of a suitable anionic surfactant may include: carboxylates such as sodium laurate, sodium oleate, sodium salt of N-acyl-N-methylglycinate, and sodium polyoxyethylene lauryl ether carboxylate; sulfonates such as sodium dodecylbenzene sulfonate, an ester salt of dialkyl sulfosuccinate, and sodium dimethyl-5-sulfoisophthate; sulfuric acid ester salts such as sodium lauryl sulfate, sodium polyoxyethylene lauryl ether sulfate, and sodium polyoxyethylene nonyl phenyl ether sulfate; phosphoric acid ester salts such as sodium polyoxyethylene lauryl phosphate, and sodium polyoxyethylene nonyl phenyl ether phosphate, and the like.

Examples of a suitable amphoteric surfactant may include carboxybetaine type surfactants, amino carboxylates, imidazolinium betaine, lecithin, and alkylamine oxides.

Hereinafter, a method of thinning a substrate using the composition for silicone resins as set forth above will be described.

FIG. 1 is a flowchart of the thinning method shown according to the performance order. FIGS. 2A to 2D are side cross-sectional views of a substrate shown according to stages of the thinning method.

Figure 2A:
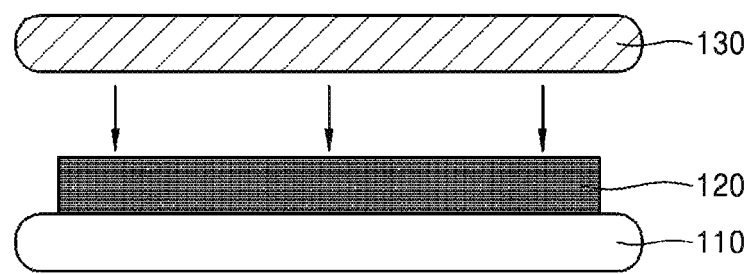
FIGS. 2A to 2D are side cross-sectional views of a substrate shown according to stages of the thinning method of FIG. 1.

Referring to FIGS. 1 and 2A, a carrier substrate 130 is attached to a target substrate 110 intended to be thinned (S100). The target substrate 110 and the carrier substrate 130 may be attached to each other using a silicone binder 120.

The target substrate 110 may include, for example, a semiconductor such as Si or Ge, or a compound semiconductor such as SiGe, SiC, GaAs, InAs, or InP. In some embodiments, the target substrate 110 may include at least one of a Group III-V material and a Group IV material. The Group III-V material may be a binary, ternary, or quaternary compound including at least one Group III atom and at least one Group V atom. The Group III-V material may be a compound including at least one atom such as In, Ga, or Al as a Group III atom and at least one atom such as As, P, or Sb as a Group V atom. For example, the Group III-V material may be selected from among InP, $In_zGa_{1-z}As$ (where z is an arbitrary number between 0 and 1), $Al_zGa_{1-z}As$ (where z is an arbitrary number between 0 and 1), or the like. The binary compound may be, for example, one of InP, GaAs, InAs, InSb, and GaSb. The ternary compound may be one of InGaP, InGaAs, AnnAs, InGaSb, GaAsSb, and GaAsP. The Group IV material may be Si or Ge. In another embodiment, the substrate 310 may have a silicon-on-insulator (SOI) structure. The target substrate 110 may have a silicon-on-insulator (SOI) structure.

The carrier substrate 130 may have sufficient thickness and strength to support the target substrate 110 while the target substrate 110 is handled and thinned. The carrier substrate 130 may include, for example, silicon (for example, a blank device wafer), soda lime glass, borosilicate glass, silicon carbide, silicon germanium, silicon nitride, gallium arsenide, sapphire, various metals or ceramics or the like or any combination thereof. However, the inventive concept is not limited thereto.

The silicone binder 120 may be, for example, a polysiloxane compound, and may bond the carrier substrate 130 to the target substrate 110 at sufficient strength. In some embodiments, the silicone binder 120 may have two or more components. The silicone binder 120 may include a single material layer, or a stacked layer of two or more material layers.

Although FIG. 2A shows that a layer of the silicone binder 120 is formed first on the target substrate 110, followed by attaching the carrier substrate 130 onto the layer of the silicone binder 120, the inventive concept is not limited thereto. In some embodiments, the layer of the silicone binder 120 may be formed first on the carrier substrate 130, followed by attaching the target substrate 110 onto the layer of the silicone binder 120. In another embodiment, a first layer of the silicone binder 120 may be formed on the target substrate 110 and a second layer of the silicone binder 120 may be formed on the carrier substrate 130. Thereafter, the first and second layers of the silicone binder 120 may be attached together, thereby bonding the target substrate 110 to the carrier substrate 130.

When the silicone binder 120 is formed on the target substrate 110 (or when the silicone binder 120 is formed on the carrier substrate 130), the silicone binder 120 may have certain fluidity enabling it to be formed as a uniformly thick layer on the target substrate 110 (or on the carrier substrate 130). The silicone binder 120 may be cured by heat, light, or the like, after the two substrates 110, 130 are bonded to each other.

Figure 2B:
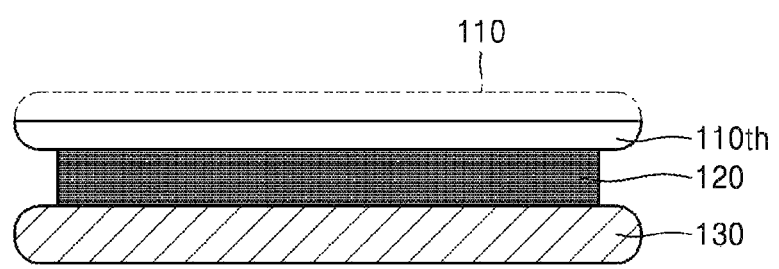

When heat is applied in order to cure the silicone binder 120, the silicone binder 120 may be heated to a temperature of 60° C. or more. In some embodiments, the silicone binder 120 may be heated to a temperature of 100° C. or more, 150° C. or more, 200° C. or more, or 220° C. or more. In some embodiments, to more firmly bond the target substrate 110 and the carrier substrate 130 to each other, pressure may be applied to press the target substrate 110 and the carrier substrate 130 together while the silicone binder 120 is heated. Referring to FIGS. 1 and 2B, after being supported by the carrier substrate 130, the target substrate 110 is subjected to thinning (S200). The thinning may continue until the target substrate 110 is thinned to a desired thickness. The thinning may be performed by, for example, grinding, chemical mechanical polishing (CMP), anisotropic etching, spin etching, or isotropic etching. However, the inventive concept is not limited thereto.

As shown in FIG. 2B, a thinned target substrate 110*th* may have a thinner thickness than the target substrate 110 initially provided. For example, the thinned target substrate 110*th* may have a thickness of about 200 µm or less, about 100 µm or less, or about 25 µm or less.

Figure 2C:
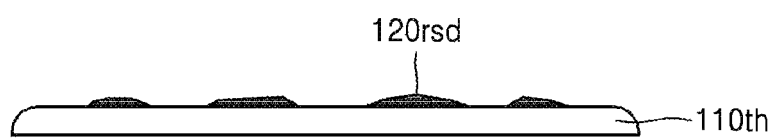
Figure 9:
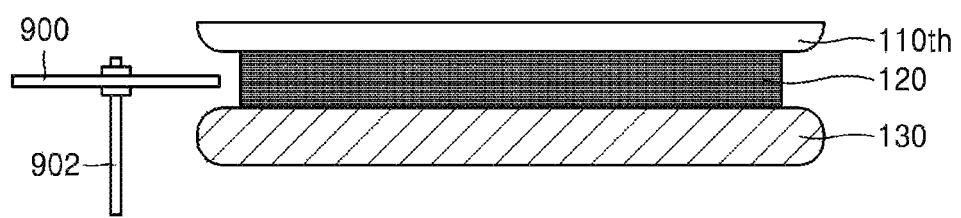
FIGS. 9 and 10 schematically illustrate a separation apparatus according to some embodiments.

Referring to FIGS. 1 and 2C, the target substrate 110*th* and the carrier substrate 130 are separated from each other (S300). To separate the target substrate 110*th* and the carrier substrate 130 from each other, physical external force or heat may be applied (e.g., from a separation apparatus as discussed below). When physical external force is applied to separate the substrates 110*th* and 130 from each other, cracks may be generated in the silicone binder 120. The cracks may be generated due to impact applied to the silicone binder 120 by a blade (e.g., of a separation apparatus as exemplarily shown in FIG. 9) or other suitable initiator. Referring to FIG. 9, the separation apparatus may include a blade 900 movably coupled to a cutting machine or motor (not shown) through a spindle 902 that, in turn, is configured to strike the silicone binder 120 with the blade 900 with sufficient force to generate cracks or scratches within the silicone binder 120.

Figure 10:
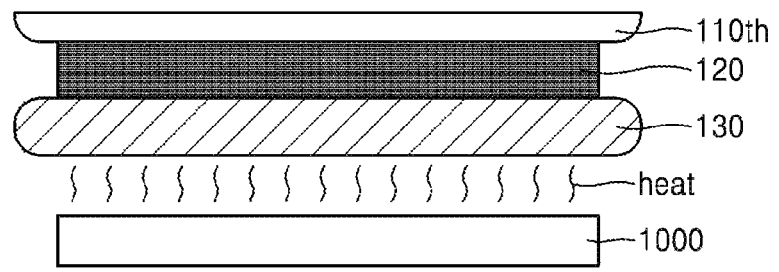

In some embodiments, the separation apparatus may be provided as exemplarily shown in FIG. 10 (e.g., as a heater 1000 arranged beneath the carrier substrate 130, operable to emit heat through the carrier substrate 130 and into the silicone binder 120 to separate the target substrate 110*th* and the carrier substrate 130 from each other with the application of heat. When heat is applied to separate the target substrate 110*th* and the carrier substrate 130, the carrier substrate 130 may be formed of a material (e.g., a metal, a ceramic, etc.) having a suitably high thermal conductivity. Once the cracks are generated in the silicone binder 120, the target substrate 110*th* and the carrier substrate 130 may be separated from each other due to propagation of the cracks.

As shown in FIG. 2C, when the target substrate 110*th* and the carrier substrate 130 are separated from each other, residues 120*rsd* of the silicone binder 120 may remain on a surface of the target substrate 110*th*. The residues 120*rsd* may be removed by using the composition for removing silicone resins as set forth above.

Figure 2D:
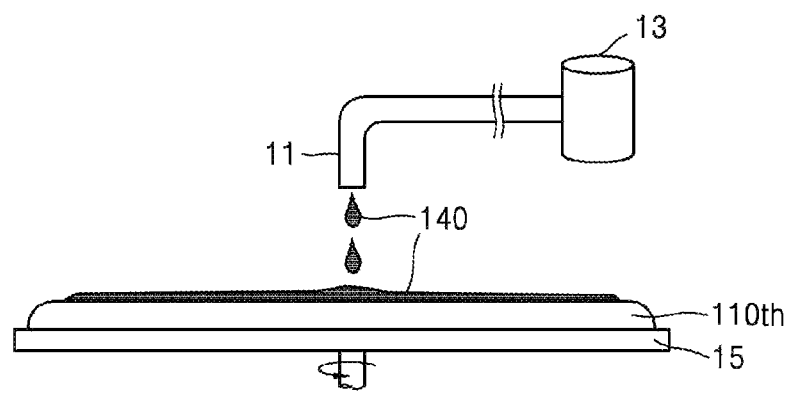

Referring to FIGS. 1 and 2D, to remove the residues 120*rsd*, a composition 140 for removing silicone resins may be provided onto the residues 120*rsd*. The composition 140 for removing silicone resins may be supplied to the surface of the target substrate 110*th* from an upper side of the target substrate 110*th*, for example, through a nozzle 11, as shown in FIG. 2D. The nozzle 11 may be coupled to an outlet of a reservoir 13 containing the composition 140. If the target substrate 110*th* is rotated (e.g., by a stage 15 that supports the target substrate 110*th*), the composition 140 for removing silicone resins may be coated to a uniform thickness on the surface of the target substrate 110*th* due to the centripetal force. In some embodiments, the target substrate 110*th* may be dipped into a bath of the composition 140 for removing silicone resins, thereby removing the residues 120*rsd*. Because the composition 140 has an excellent decomposition rate with respect to silicone resins, the composition 140 provides for effective removal of silicone resins remaining on a semiconductor substrate in processes such as a process of backside grinding of the semiconductor substrate, a process of forming a backside electrode, or the like, when the composition 140 is used according to the disclosed embodiments.

Figure 3A:
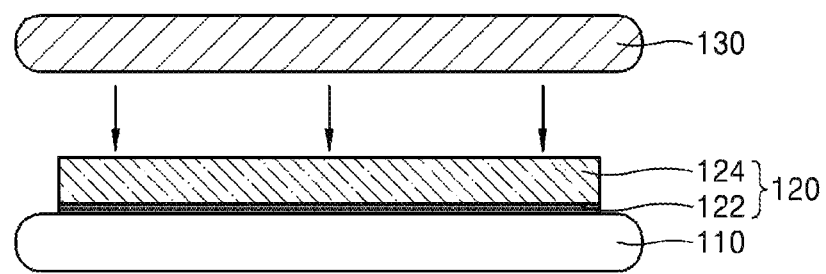
FIGS. 3A to 3C are side cross-sectional views for explaining a method of thinning a target substrate according to another embodiment.
Figure 3B:
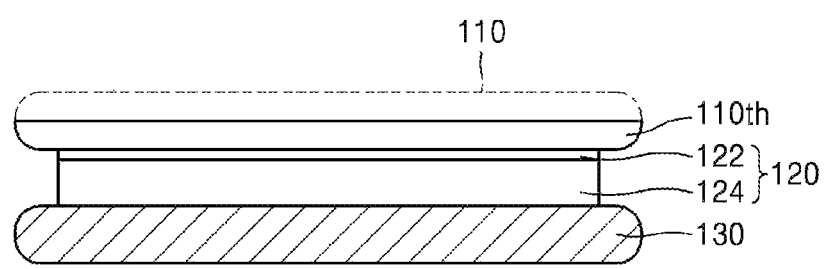
Figure 3C:
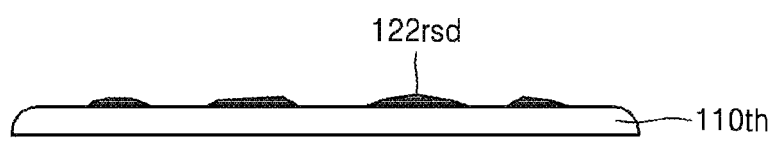

FIGS. 3A to 3C are side cross-sectional views for explaining a method of thinning the target substrate 110 according to another embodiment. In the embodiment depicted in FIG. 3A, a silicone release layer 122 may be formed on the target substrate 110, and a silicone adhesive layer 124 may be formed on the silicone release layer 122.

The silicone release layer 122 may include, for example, hexamethyldisiloxane (HMDSO). The silicone release layer 122 of hexamethyldisiloxane may be formed by, for example, chemical vapor deposition, atomic layer deposition, or the like. In some embodiments, the silicone release layer 122 may have a thickness of, for example, about 10 nm or more, about 30 nm or more, about 50 nm or more, or about 70 nm or more. In some embodiments, the silicone release layer 122 may have a thickness of, for example, about 500 nm or less, about 400 nm or less, about 300 nm or less, or about 150 nm or less.

In some embodiments, the silicone release layer 122 may include, for example, an addition type silicone, a condensation type silicone, or an energy ray-curable silicone. In addition, to adjust a peel strength of the silicone release layer 122, the silicone release layer 122 may further include non-functional polydimethylsiloxane, a phenyl-modified silicone, a silicone resin, silica, or a cellulose compound, as an additive. Here, the silicone release layer 122 may be formed by gravure coating, bar coating, spray coating, spin coating, air knife coating, roll coating, blade coating, gate roll coating, die coating, or the like. However, the inventive concept is not limited thereto.

The silicone adhesive layer 124 may be formed by using, for example, brush coating, air spray coating, electrostatic coating, dip coating, spin coating, gravure coating, bar coating, curtain coating, air knife coating, roll coating, blade coating, gate roll coating, die coating, or the like. The silicone adhesive layer 124 may include, for example, polydimethylsiloxane, polymethylphenylsiloxane, polyethylphenylsiloxane, or the like. In some embodiments, the silicone adhesive layer 124 may be a material layer which includes monomers capable of forming polydimethylsiloxane, polymethylphenylsiloxane, polyethylphenylsiloxane, or the like by polymerization. In addition, the silicone adhesive layer 124 may further include initiators which allows polymerization to be initiated by energy applied from the outside of the silicone adhesive layer 124. Next, the carrier substrate 130 may be bonded onto the silicone adhesive layer 124. Due to the bonding, the carrier substrate 130 may be firmly coupled to the target substrate 110.

In some embodiments, when energy such as heat or light is applied to the silicone adhesive layer 124, the silicone adhesive layer 124 may be cured by polymerization, solvent removal, or the like, thereby strongly coupling the target substrate 110 and the carrier substrate 130 to each other.

Referring to FIG. 3B, the target substrate 110 is subjected to thinning. For example, the target substrate 110 may be thinned as exemplarily described above with respect to FIG. 2B. Since the thinning of the target substrate 110 has been described with reference to FIG. 2B, overlapping descriptions thereof are omitted.

The silicone release layer 122 may directly contact an active surface of the thinned target substrate 110*th*, as shown in FIG. 3B. In addition, the silicone adhesive layer 124 may directly contact the carrier substrate 130. In some embodiments, the silicone release layer 122 may not contact the carrier substrate 130. In some embodiments, the silicone adhesive layer 124 may partially contact the thinned target substrate 110*th*. (e.g., because the silicone release layer 122 is not formed as a sufficiently conformal layer with respect to complicated topography on the active surface of the target substrate 110). Descriptions of this will be made below in detail.

The target substrate 110th and the carrier substrate 130, shown in FIG. 3B, may be separated from each other. If physical external force is applied to separate the target substrate 110th and the carrier substrate 130 from each other, the target substrate 110th and the carrier substrate 130 may be separated from each other along the silicone release layer 122 as shown in FIG. 3C. However, the target substrate 110th and the carrier substrate 130 may be separated from each other while the silicone release layer 122 partially remains on the carrier substrate 130, or while the silicone adhesive layer 124 partially remains on the target substrate 110th. Accordingly, although most of the residues 122rsd remaining on the active surface of the target substrate 110th are derived from the silicone release layer 122, some of the residues 122rsd derived from the silicone adhesive layer 124 may be present on the active surface of the target substrate 110th.

Next, the residues 122rsd may be removed by using the composition 140 for removing silicone resins according to the disclosure as set forth above. Since details of this have been described with reference to FIG. 2D, additional descriptions thereof are omitted.

Figure 4A:
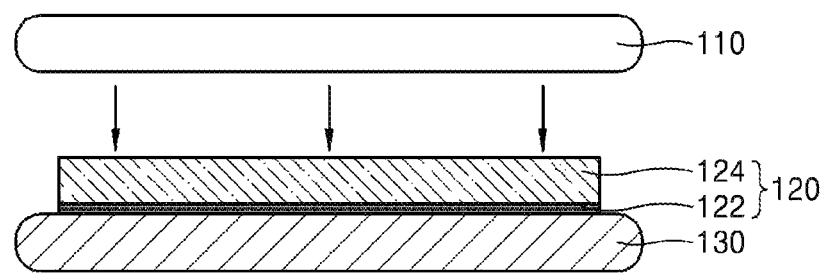
FIGS. 4A to 4C are side cross-sectional views for explaining a method of thinning a target substrate according to a further embodiment.
Figure 4B:
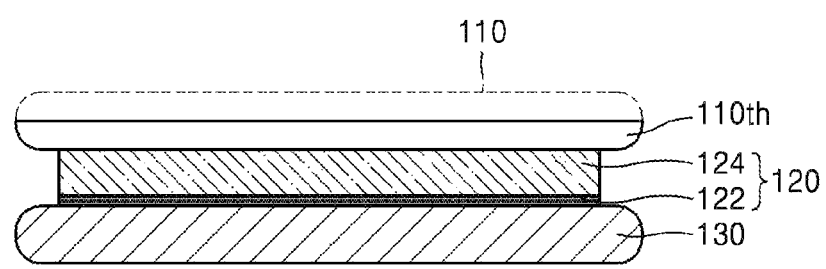
Figure 4C:
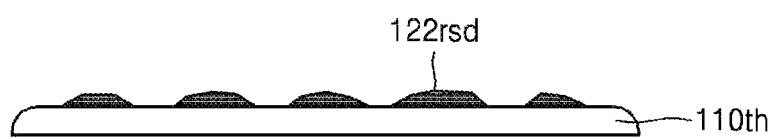

FIGS. 4A to 4C are side cross-sectional views for describing a method of thinning the target substrate 110 according to a further embodiment. Referring to FIG. 4A, the silicone release layer 122 may be formed on the carrier substrate 130, and the silicone adhesive layer 124 may be formed on the silicone release layer 122. Since the silicone release layer 122 and the silicone adhesive layer 124 have been described in detail with reference to FIG. 3A, additional descriptions thereof are omitted.

The target substrate 110 may be bonded onto the silicone adhesive layer 124, as shown in process in FIG. 4A. Referring to FIG. 4B, the target substrate 110 is subjected to thinning. For example, the target substrate 110 may be thinned as exemplarily described above with respect to FIG. 2B. Since the thinning of the target substrate 110 has been described with reference to FIG. 2B, overlapping descriptions thereof are omitted.

Here, the silicone release layer 122 may directly contact the carrier substrate 130, and the silicone adhesive layer 124 may directly contact the thinned target substrate 110th. In some embodiments, the silicone adhesive layer 124 may partially, directly contact the carrier substrate 130.

Referring to FIG. 4C, the target substrate 110th and the carrier substrate 130 may be separated from each other. If physical external force is applied to separate the target substrate 110th and the carrier substrate 130 from each other, the target substrate 110th and the carrier substrate 130 may be separated from each other along the silicone release layer 122. However, the target substrate 110th and the carrier substrate 130 may be separated from each other while the silicone release layer 122 partially remains on target substrate 110th, or while the silicone adhesive layer 124 partially remains on the carrier substrate 130. Accordingly, although most of the residues 122rsd remaining on the active surface of the target substrate 110th are derived from the silicone adhesive layer 124, some of the residues 122rsd derived from the silicone release layer 122 may be present on the active surface of the target substrate 110th.

Next, the residues 122rsd may be removed by using the composition 140 for removing silicone resins according to the disclosure as set forth above. Since details of this have been described with reference to FIG. 2D, additional descriptions thereof are omitted.

Although the inventive concept is not limited to any specific principle, it is believed that the alkyl ammonium fluoride salt as set forth above may serve to reduce a molecular weight of a resin component of the silicone binder.

In addition, although the inventive concept is not limited to any specific principle, it is believed that the heterocyclic solvent as set forth above may serve to expand the resin component of the silicone binder and to dissolve the alkyl ammonium fluoride salt represented by Formula (1). Furthermore, when the heterocyclic solvent is a polar and aprotic solvent, such dissolving action of the heterocyclic solvent may be more actively and stably performed, and may promote decomposition of the silicone binder by stabilizing a reaction intermediate produced due to decomposition of the silicone binder, which is performed by the alkyl ammonium fluoride salt.

Figure 5A:
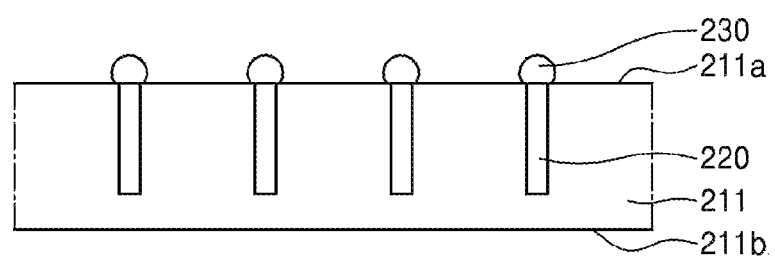
FIGS. 5A to 5I are side cross-sectional views of a semiconductor package shown according to the order of performing a method of fabricating the semiconductor package according to an embodiment.
Figure 5B:
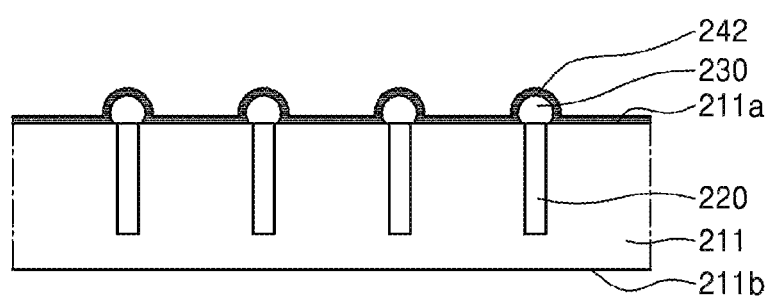
Figure 5C:
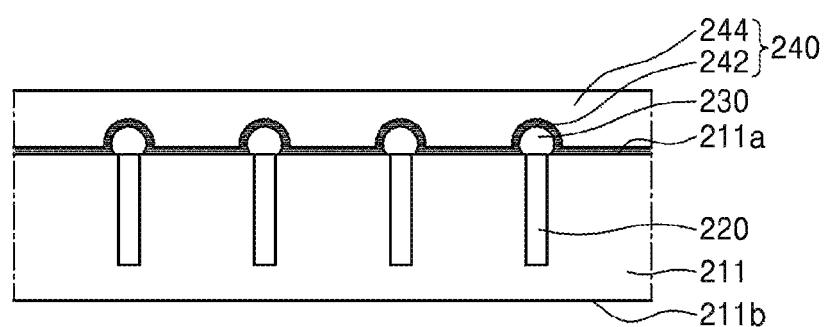
Figure 5D:
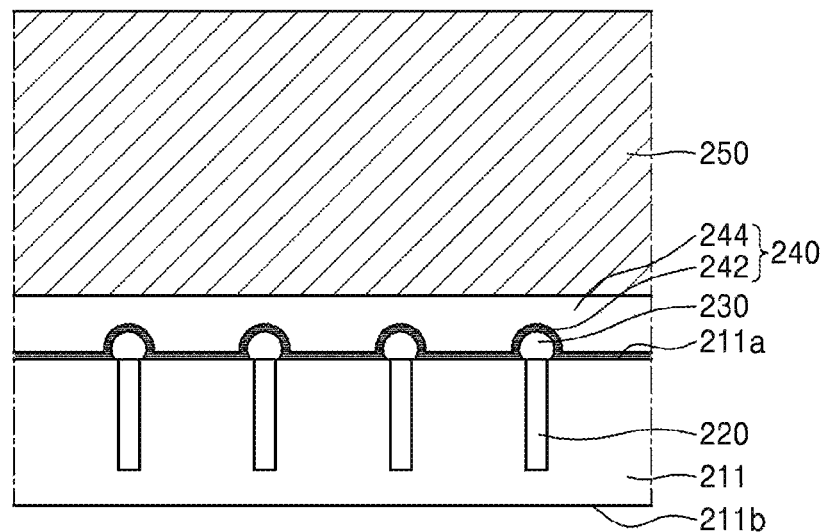
Figure 5E:
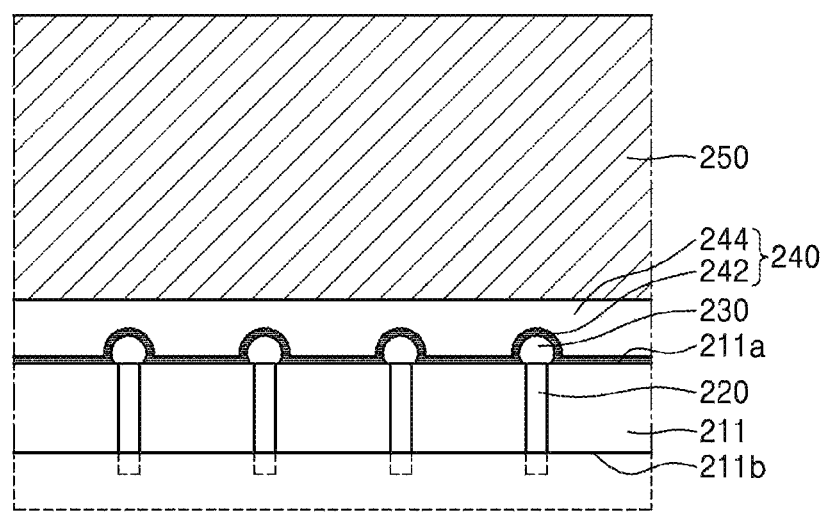
Figure 5F:
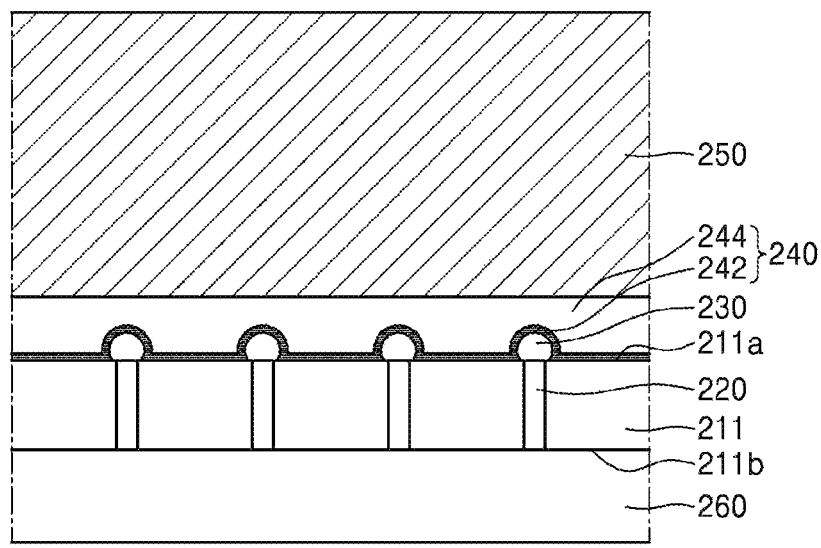
Figure 5G:
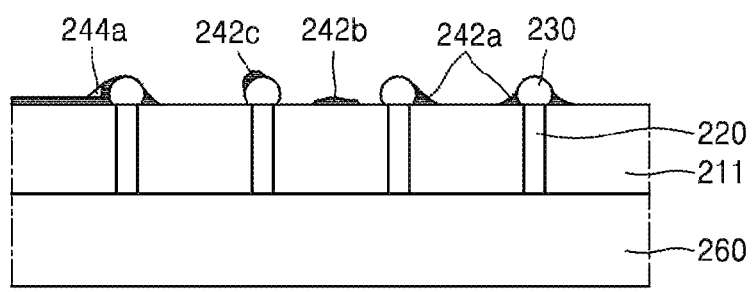
Figure 5H:
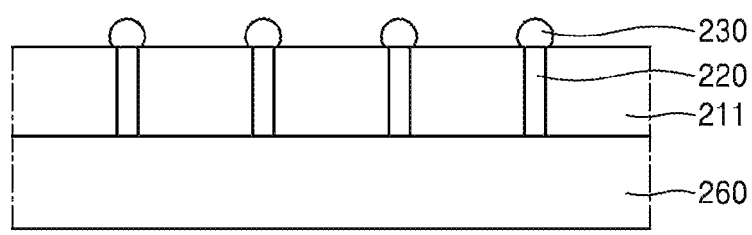
Figure 5I:
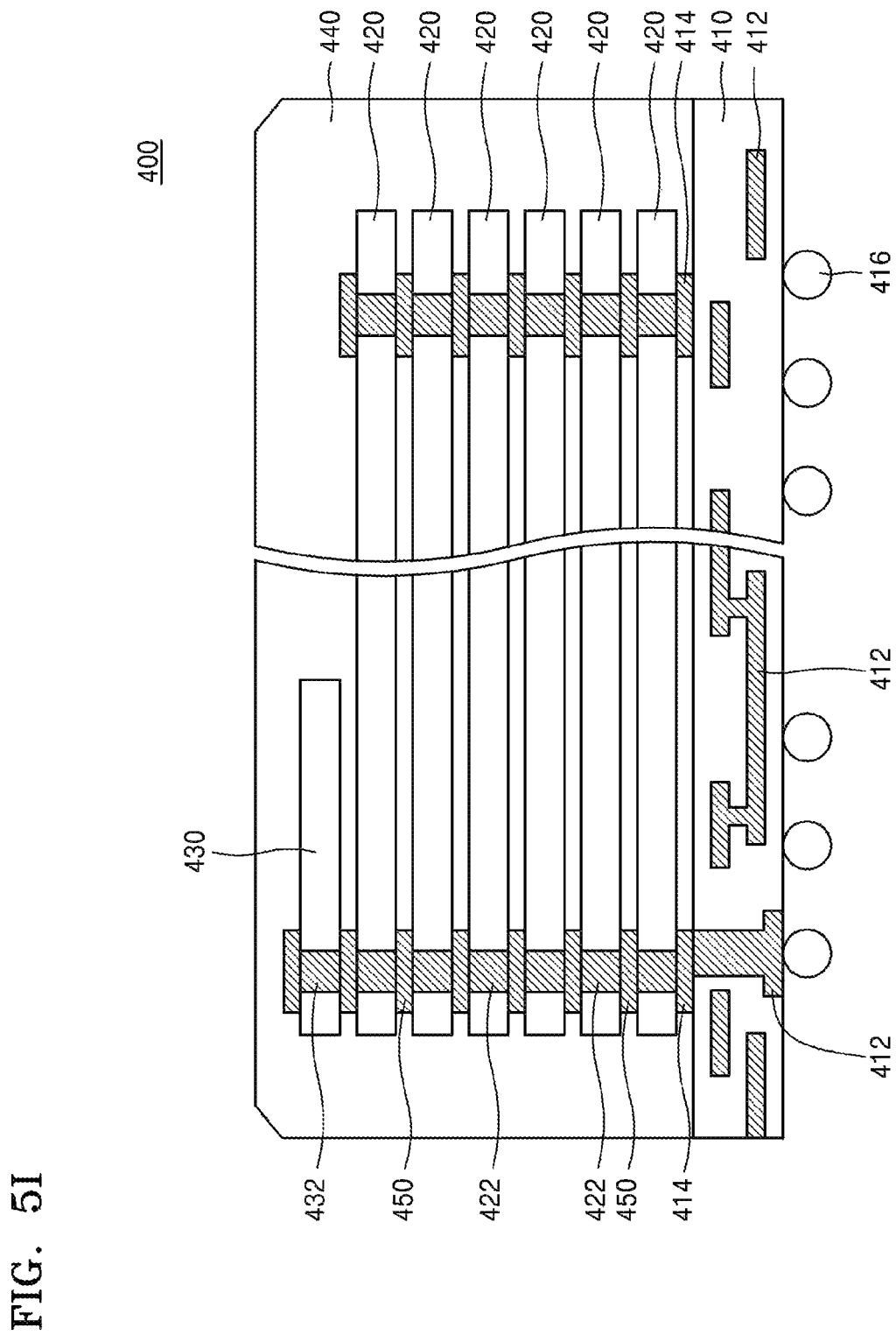

FIGS. 5A to 5I are side cross-sectional views of a semiconductor package shown according to the sequential order of a method of fabricating the semiconductor package according to an embodiment of the present disclosure. Referring to FIG. 5A, a device substrate 211 is provided. The device substrate 211 may have an active surface 211a and an opposite surface 211b facing away from the active surface 211a. A large number of semiconductor devices may be formed on the active surface 211a. In addition, a through-electrode 220 may be provided inside the device substrate 211. The through-electrode 220 may be electrically connected to the semiconductor devices. The through-electrode 220 may extend from the active surface 211a toward the opposite surface 211b. Furthermore, a conductive bump 230 may be provided on one side of the through-electrode 220. FIGS. 5B-5G are described below after the description of FIG. 6 and FIGS. 5H-5I are described below after the description of FIG. 7.

Figure 6:
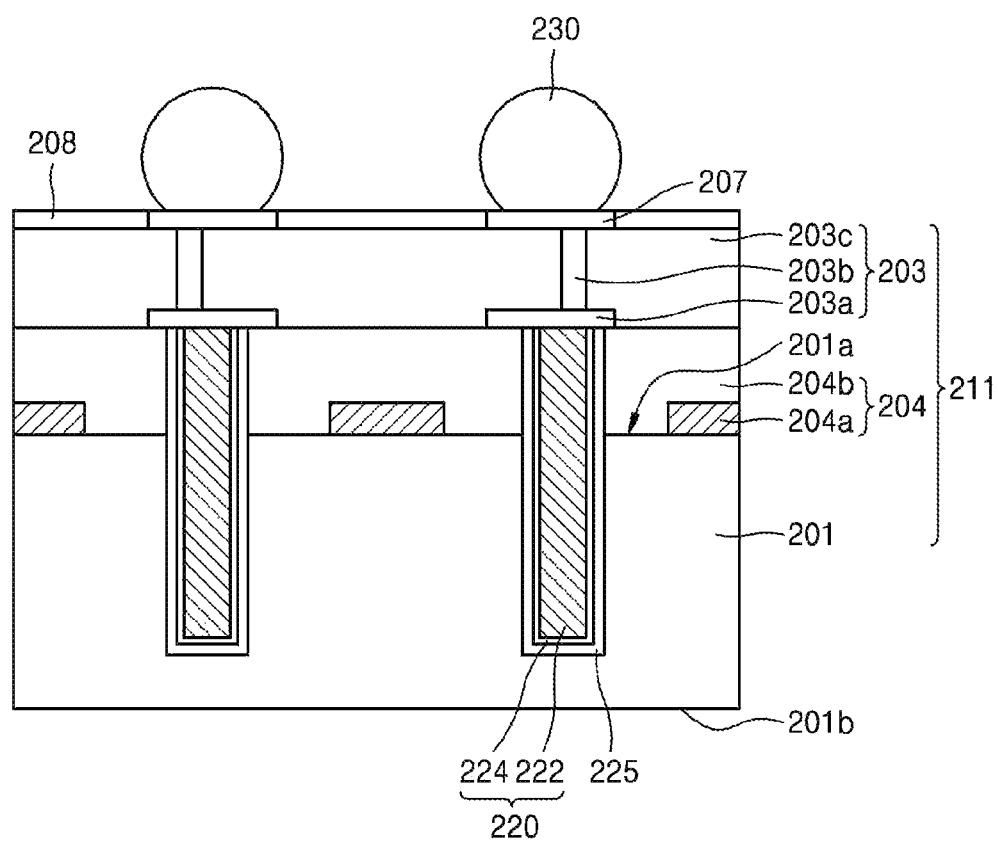
FIG. 6 is a partial enlarged view showing a structure of a device substrate of FIG. 5A in more detail.

FIG. 6 is a partial enlarged view showing a structure of the device substrate 211 of FIG. 5A in more detail. Referring to FIG. 6, a semiconductor device 204a and an interlayer dielectric 204b may be formed on a first surface 201a of a semiconductor substrate 201, thereby forming a circuit layer 204.

The semiconductor substrate 201 may include a semiconductor wafer. For example, the semiconductor substrate 201 may include a Group IV material or a Group III-V compound. More specifically, the semiconductor substrate 201 may include Si, SiC, SiGe, SiGeC, Ge alloys, GaAs, InAs, TnP, other Group III-V or Group II-VI compound semiconductors, or organic semiconductor substrates. In addition, the semiconductor substrate 201 may be formed of a single crystal wafer such as a silicon single crystal wafer in terms of a formation method. However, the semiconductor substrate 201 is not limited to the single crystal wafer, and may be provided from various wafers such as an epitaxial wafer, a polished wafer, an annealed wafer, a silicon-on-insulator (SOI) wafer, and the like. Here, the epitaxial wafer refers to wafers in which a crystalline material is grown on a single crystal substrate.

The semiconductor substrate 201 may have a first surface 201a and a second surface 201b that is a surface opposite to the first surface 201a. In addition, the first surface 201a of the semiconductor substrate 201 may be an active surface, and the circuit layer 204 may be formed on the first surface 201a. On the first surface 201a of the semiconductor substrate 201, on which the circuit layer 204 is formed, doping regions, which are doped with a p-type impurity, such as phosphorus (P), arsenic (As), or antimony (Sb), and/or an n-type impurity, such as boron (B), indium (In), or gallium (Ga), may be formed. The second surface 201b, which is a surface opposite to the first surface 201a, may not be doped with an impurity. Hereinafter, in some cases, the first surface 201a may be referred to as an active surface, and the second surface 201b may be referred to as a non-active surface.

The interlayer dielectric 204b may cover the semiconductor device 204a on the first surface 201a. The interlayer dielectric 204b may function to physically and/or electrically insulate circuit devices in the semiconductor device 204a from each other. In addition, the interlayer dielectric 204b may serve to separate a single layer or multiple layers of wires in a wiring layer 203 from the circuit devices in the semiconductor device 204a. In other words, the single-layer or multi-layer wiring layer 203 is insulated from the circuit devices in the semiconductor device 204a by the interlayer dielectric 204b. The interlayer dielectric 204b may have a stacked structure obtained by stacking various layers formed of materials such as oxide, nitride, low-K dielectrics, high-K dielectrics, or combinations thereof.

The semiconductor device 204a may be formed within the interlayer dielectric 204b on the first surface 201a of the semiconductor substrate 201, and may include a large number of circuit devices. The semiconductor device 204a may include various circuit devices, for example, active devices such as transistors and diodes, and/or passive devices such as capacitors and resistors, according to a kind of semiconductor device. The semiconductor device 204a may include at least one selected from among: a system large-scale integration (LSI); a logic circuit; an image sensor such as a CMOS imaging sensor (CIS); a memory device such as a flash memory, a DRAM, an SRAM, an EEPROM, a PRAM, an MRAM, a Re RAM, a high bandwidth memory (HBM), or a hybrid memory cube (HMC); and a microelectromechanical system (MEMS) device.

The circuit devices of the semiconductor device 204a may be electrically connected to the wires in the wiring layer 203 through a conductive connector such as a via-contact. The wiring layer 203 may include an inter-metal dielectric 203c, a conductive wire or conductive pad 203a, and a vertical plug 203b.

The inter-metal dielectric 203c may be formed on the circuit layer 204, that is, on the interlayer dielectric 204b, and may cover the wire 203a. The inter-metal dielectric 203c may serve to separate two or more wires 203a from each other. Although the inter-metal dielectric 203c is shown as one layer in FIG. 6, the inter-metal dielectric 203c may have multiple layers. For example, the inter-metal dielectric 203c may have two or more layers, depending upon the number of layers including the wire 203a.

The wire 203a may be formed of at least one layer. In addition, the wire 203a may be electrically connected to the circuit devices in the semiconductor device 204a to constitute a certain circuit, or may be used to electrically connect the circuit devices to devices external to the semiconductor device 204a. Although only one layer of the wire, for example, a first wire 203a is shown in FIG. 6, additional wires may be formed in different layers from the layer of the first wire 203a. The additional wires may be electrically connected to the first wire 203a through the vertical plug or the like. Furthermore, the first wire 203a may be connected to an electrode pad 207 through the vertical plug 203b. The first wire 203a may be formed of a metal such as copper, aluminum, tungsten, or the like.

Although the wire and the material of the wire have been described, the inventive concept is not limited thereto. In addition, since structures of the wire and the vertical plug and a connection structure therebetween are shown merely as examples in FIG. 6, it will be understood by those of ordinary skill in the art that the structures of the wire and the vertical plug, the connection structure therebetween, and the like are not limited to the examples of FIG. 6.

The wire 203a and the vertical plug 203b may include the same or different materials. The wire 203a and the vertical plug 203b may include a central metal constituting the wire, and at least one barrier metal layer which surrounds the central metal and prevents diffusion of the central metal.

The through-electrode 220 may penetrate the circuit layer 204, and may extend from the first surface 201, which is the active surface of the substrate 201, toward the second surface 201b. For example, the through-electrode 220 may be a through-silicon via (TSV). One end of the through-electrode 220 may be electrically connected to the wire 203a. In addition, the other end of the through-electrode 220 may extend toward the second surface 201b to be terminated in the semiconductor substrate 201.

The through-electrode 220 may include at least one metal. Specifically, the through-electrode 220 may include a wiring metal layer 222 in a central portion thereof and a barrier metal layer 224 surrounding the wiring metal layer 222. The wiring metal layer 222 may include one or more of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr) or the like. For example, the wiring metal layer 222 may include a stacked structure of one or more selected from among tungsten (W), aluminum (Al), and copper (Cu).

In addition, the barrier metal layer 224 may include a stacked structure of one or more selected from among titanium (Ti), tantalum (Ta), titanium nitride (TiN), and tantalum nitride (TaN). However, the wiring metal layer 222 and the barrier metal layer 224 are not limited to the materials set forth above. Further, depending upon a metal selected as a material for the wiring metal layer 222, the barrier metal layer 224 may be omitted.

Furthermore, a spacer insulating layer 225 may be provided on an outer surface of the barrier metal layer 224. The spacer insulating layer 225 may prevent the semiconductor substrate 201 or the circuit devices in the circuit layer 204 from directly contacting the through-electrode 220. The spacer insulating layer 225 may extend along a surface of the barrier metal layer 224. The spacer insulating layer 225 may include an oxide film or a nitride film. For example, the spacer insulating layer 225 may include a silicon oxide ($SiO_2$) film.

In FIG. 6, the through-electrode 220 is shown as having a via-middle structure. That is, after the semiconductor device 204a and the interlayer dielectric 204b are formed, and before the wiring layer 203 is formed, the through-electrode 220 may be formed. However, the inventive concept is not limited thereto, and may also be applied to a via-first structure or a via-last structure. Since the via-first structure or the via-last structure is well known to those of ordinary skill in the art, details thereof are omitted.

The electrode pad 207 may be formed on the inter-metal dielectric 203c, and may be electrically connected to the wire 203a in the wiring layer 203 through the vertical plug 203b. In some cases, an additional interlayer dielectric may be further interposed between the inter-metal dielectric 203c and the electrode pad 207, and the electrode pad 207 and the wire 203a may be electrically connected to each other through a vertical contact penetrating the additional interlayer dielectric.

A passivation layer 208 may be formed on an upper surface of the inter-metal dielectric 203c and a side surface of the electrode pad 207. The passivation layer 208 may protect an active surface of a semiconductor chip, and may include an oxide film, a nitride film, or combinations thereof.

The conductive bump 230 may be formed on the electrode pad 207. The conductive bump 230 may include, for example, tin (Sn). In some cases, the conductive bump 230 may include tin (Sn), palladium (Pd), nickel (Ni), silver (Ag), copper (Cu), or the like or combinations thereof. The conductive bump 230 may have a semi-spherical shape. The conductive bump 230 has a semi-spherical shape through a reflow process, and may have a shape that is slightly different from a semi-spherical shape depending upon the reflow process.

Referring to FIG. 5B, a silicone release layer 242 may be formed on the active surface 211a and a surface of the conductive bump 230. The silicone release layer 242 may be conformally formed along the active surface 211a and the surface of the conductive bump 230. In some embodiments, the silicone release layer 242 may be at least partially conformally formed along the active surface 211a and the surface of the conductive bump 230. Since details of the silicone release layer 242 are the same as those of the silicone release layer 122 described with reference to FIG. 3A, additional descriptions thereof are omitted. The silicone release layer 242 may be formed by a method such as chemical vapor deposition (CVD), atomic layer deposition (ALD), or the like. The silicone release layer 242 may be formed at a temperature of about 200° C. to about 700° C., about 300° C. to about 650° C., or about 400° C. to about 600° C.

Referring to FIG. 5C, a silicone adhesive layer 244 is formed on an upper side of the silicone release layer 242. The silicone adhesive layer 244 may constitute a silicone binder 240 together with the silicone release layer 242.

The silicone adhesive layer 244 may include, for example, a silicone monomer or oligomer, and may be a polymerizable composition capable of being used for the purpose of bonding. The silicone adhesive layer 244 may have viscosity or fluidity which allows the silicone adhesive layer 244 to be formed to a relatively uniform thickness by a liquid process such as spin coating or the like. The silicone adhesive layer 244 may be formed by using a method such as brush coating, air spray coating, electrostatic coating, dip coating, spin coating, gravure coating, bar coating, curtain coating, air knife coating, roll coating, blade coating, gate roll coating, die coating, or the like. The silicone adhesive layer 244 may be formed to a thickness that is thicker than a height of the protruding conductive bump 230.

Referring to FIG. 5D, a carrier substrate 250 is attached onto an upper side of the silicone adhesive layer 244.

The carrier substrate 250 may include, for example, silicon (for example, a blank device wafer), soda lime glass, borosilicate glass, silicon carbide, silicon germanium, silicon nitride, gallium arsenide, sapphire, various metals or ceramics, or the like or any combination thereof. However, the inventive concept is not limited thereto.

After the carrier substrate 250 is attached, the silicone adhesive layer 244 may be cured for robust bonding between the carrier substrate 250 and the device substrate 211. The silicone adhesive layer 244 may be cured through solvent removal and/or polymerization. For example, polymerization of the silicone adhesive layer 244 may be initiated by applying energy, such as light, heat, or the like, to the silicone adhesive layer 244.

Referring to FIG. 5E, after being supported by the carrier substrate 250, the device wafer 211 is subjected to thinning. The device wafer 211 may be thinned until the through-electrode 220 is sufficiently exposed. The thinning of the device wafer 211 may be performed by, for example, a method such as grinding, chemical mechanical polishing (CMP), anisotropic etching, spin etching, isotropic etching, or the like. However, the inventive concept is not limited thereto.

Referring to FIG. 5F, an adhesive tape 260 may be attached to the thinned device substrate 211. The adhesive tape 260 may be attached for the purpose of imparting additional mechanical strength to the device wafer 211 and preventing the device wafer 211 from being separated into individual chips (e.g., in a subsequent dicing process).

Referring to FIG. 5G, the carrier substrate 250 may be removed. When the carrier substrate 250 is removed, although the device wafer 211 and the carrier substrate 250 would be ideally separated from each other along the silicone release layer 242, residues of the silicone adhesive layer 244 and the silicone release layer 242 may actually remain on the surfaces of the device substrate 211 and the conductive bump 230.

That is, as shown in FIG. 5G, residues 242a of the silicone release layer 242 may remain in a corner portion between the conductive bump 230 and the device substrate 211. In addition, residues 242b of the silicone release layer 242 may also remain on the surface of the device substrate 211. Further, residues 242c of the silicone release layer 242 may also remain on the surface of the conductive bump 230. Furthermore, residues 244a of the silicone adhesive layer 244 may remain in certain portions of the surfaces.

Figure 7:
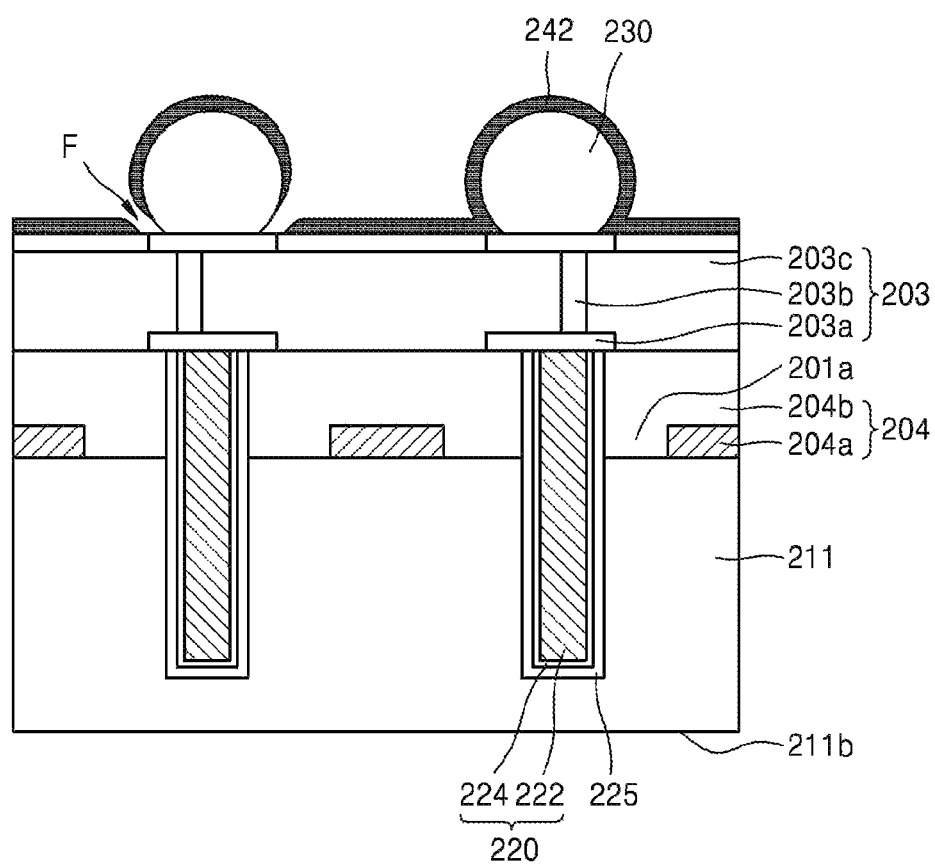
FIG. 7 is a side cross-sectional view describing one of various causes for residues of a silicone adhesive layer to remain.

FIG. 7 is a side cross-sectional view for describing one of various causes for the residues 244a of the silicone adhesive layer 244a to remain. Referring to FIG. 7, when the silicone release layer 242 is formed by chemical vapor deposition, it may be difficult to cover all surfaces of protruding features to a uniform thickness. In other words, although the silicone release layer 242 may be formed to a uniform thickness as shown on the surface of the conductive bump 230 in the right side in FIG. 7, the silicone release layer 242 may not be formed in a corner portion F as shown in the vicinity of the conductive bump 230 in the left side in FIG. 7.

If the silicone adhesive layer 244 is formed as set forth above, the silicone adhesive layer 244 may directly contact the device substrate 211. If the silicone adhesive layer 244 directly contacts the device substrate 211, some of the silicone adhesive layer 244 remains on the device substrate 211 when the carrier substrate 250 is separated.

Referring to FIG. 5H, to remove the residues 242a, 242b, 242c, 244a, the device substrate 211 may be cleaned by using the composition for removing silicone resins according to the disclosure as set forth above. Since the compositions for removing silicone resins have been described above, additional descriptions thereof are omitted.

Referring to FIG. 5I, the device substrate 211 fabricated as above is subjected to dicing, whereby individual semiconductor chips 420 are obtained, and a semiconductor package 400 may be fabricated by using the semiconductor chips 420. For example, the semiconductor package 400 may include a plurality of semiconductor chips 420 sequentially stacked on a package substrate 410. A control chip 430 is connected onto the plurality of semiconductor chips 420. The stacked structure of the plurality of semiconductor chips 420 and the control chip 430 is sealed by an encapsulant 440 such as a thermosetting resin. Although the stacked structure in which six semiconductor chips 420 are vertically stacked is shown as an example in FIG. 5I, the number and stacking direction of the semiconductor chips 420 are not limited to the example. The number of the semiconductor chips 420 may be less than or greater than six, as needed. The plurality of semiconductor chips 420 may be arranged in a horizontal direction, or may be arranged in a combination structure of vertical mounting and horizontal mounting. In some embodiments, the control chip 430 may be omitted.

The package substrate 410 may include a flexible printed circuit board, a rigid printed circuit board, or combinations thereof. The package substrate 410 includes a substrate-internal wire 412 and a connection terminal 414. The connection terminal 414 may be formed on one surface of the package substrate 410. A solder ball 416 is formed on the other surface of the package substrate 410. The connection terminal 414 is electrically connected to the solder ball 416 through the substrate-internal wire 412. In some embodiments, the solder ball 416 may be replaced by a conductive bump or a lead grid array (LGA).

The plurality of semiconductor chips 420 and the control chip 430 may include through-electrodes 422, 432. Each of the through-electrodes 422, 432 may include the wiring metal layer 222 in a central portion thereof and the barrier metal layer 224 surrounding the wiring metal layer 222, as described with reference to FIG. 6.

The through-electrodes 422, 432 may be electrically connected to the connection terminal 414 of the package substrate 410 by a conductive member 450 such as a bump. In some embodiments, the through-electrode 432 in the control chip 430 may be omitted.

Each of the plurality of semiconductor chips 420 may include a system LSI, a flash memory, a DRAM, an SRAM, an EEPROM, a PRAM, an MRAM, or an RRAM. The control chip 430 may include logic circuits such as a serializer/deserializer (SER/DES) circuit.

Figure 8A:
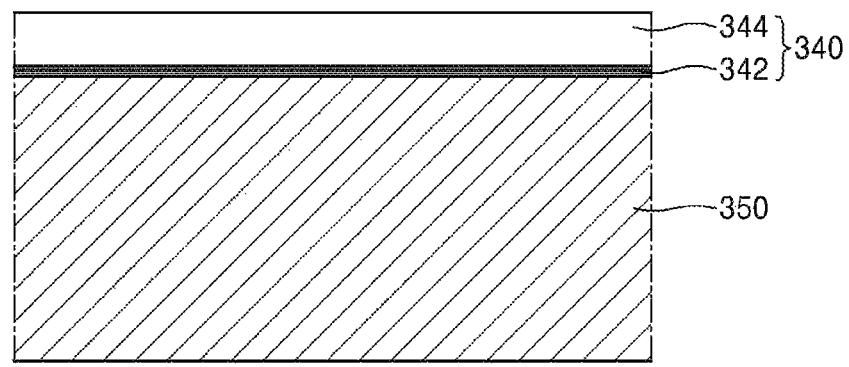
FIGS. 8A to 8G are side cross-sectional views shown according to the sequential order of performing a method of fabricating the semiconductor package according to another embodiment.

FIGS. 8A to 8G are side cross-sectional views shown according to the performance order of a method of fabricating the semiconductor package according to another embodiment. Referring to FIG. 8A, a silicone binder 340 is formed on a carrier substrate 350. The silicone binder 340 may include a silicone release layer 342 and a silicone adhesive layer 344. Since details of the silicone release layer 342 and the silicone adhesive layer 344 are the same as those of the silicone release layer 122 and the silicone adhesive layer 124 variously described in detail with reference to FIGS. 3A, 4A, and 5A to 5C, details thereof are omitted. Moreover, the carrier substrate 350 may be provided as exemplarily described above with respect to the carrier substrate 250.

Figure 8B:
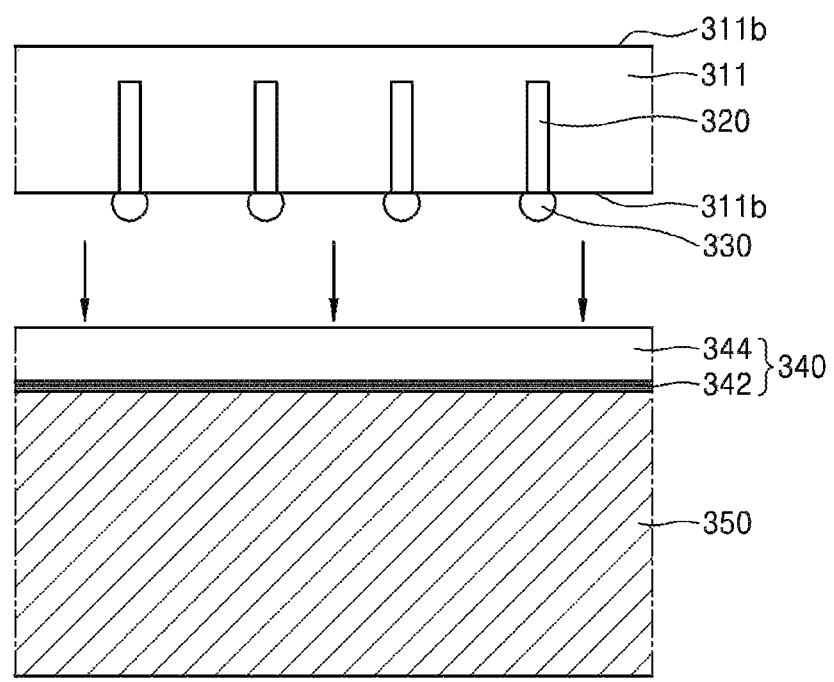

Referring to FIG. 8B, a device substrate 311 is attached onto the silicone adhesive layer 344. The device substrate 311 may include a through-electrode 320 therein. One end of the through-electrode 320 may be connected to a conductive bump 330 on an active surface 311a of the device substrate 311, and the other end of the through-electrode 320 may extend toward an opposite surface 311b that is opposite to the active surface 311a.

Figure 8C:
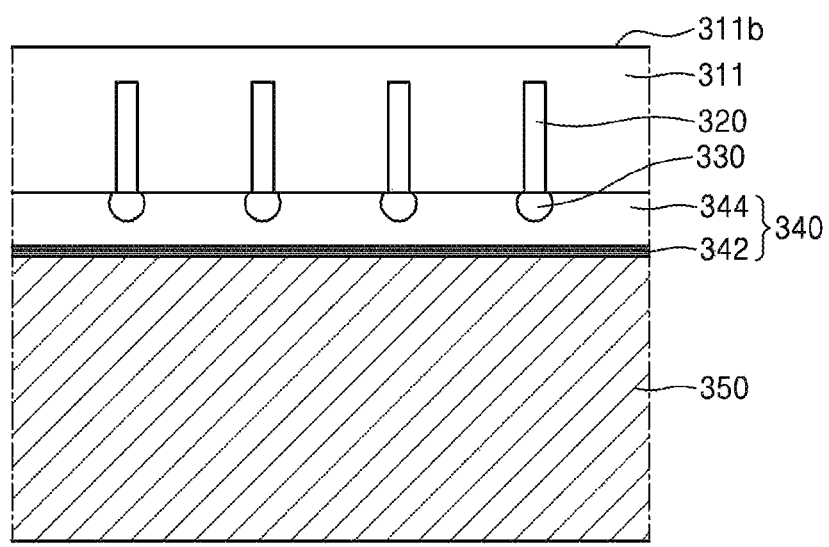

Referring to FIG. 8C, the device substrate 311 and the carrier substrate 350 may be firmly bonded to each other by curing the silicone adhesive layer 344. To cure the silicone adhesive layer 344, energy such as heat or light may be applied to the silicone adhesive layer 344. In particular, since light irradiation may be facilitated when a glass substrate is used as the carrier substrate 350, a photopolymerizable material may be used as the silicone adhesive layer 344.

Figure 8D:
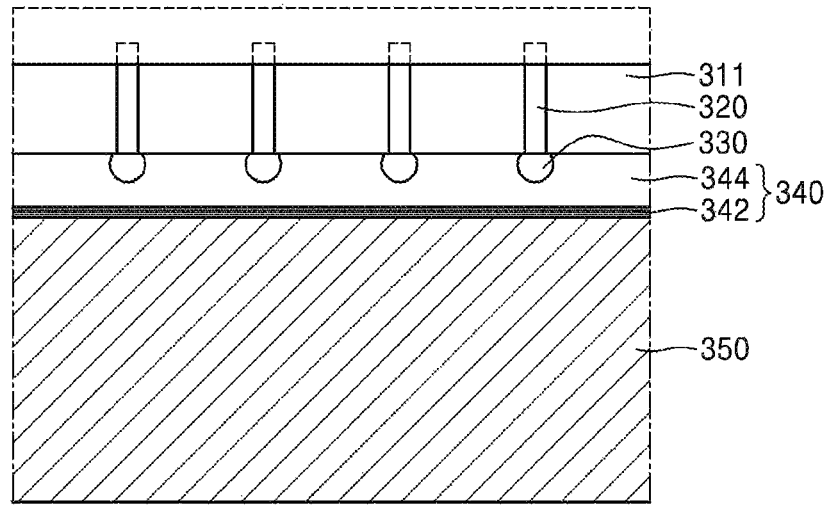

Referring to FIG. 8D, after being supported by the carrier substrate 350, the device substrate 311 is subjected to thinning. The device substrate 311 may be thinned until the through-electrode 320 is sufficiently exposed. Since a method for the thinning has been described with reference to FIG. 5E or the like, overlapping descriptions thereof are omitted.

Figure 8E:
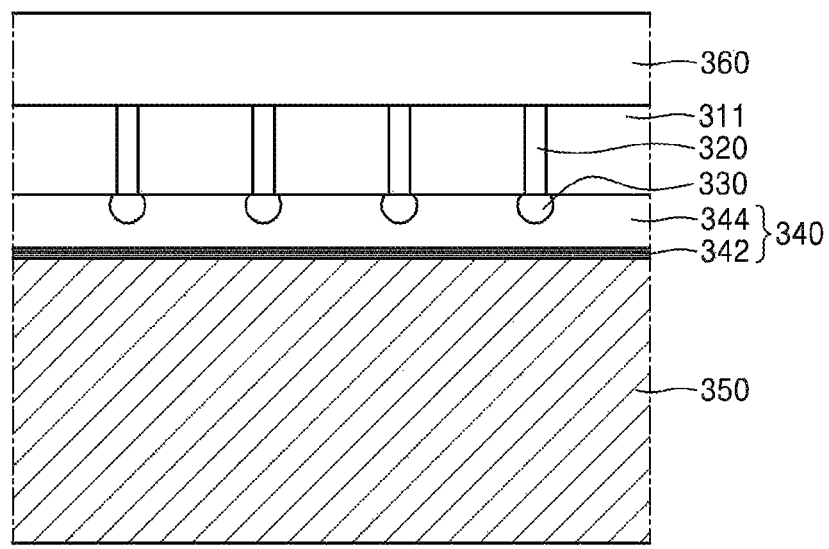

Referring to FIG. 8E, an adhesive tape 360 may be attached to the thinned device substrate 311. The adhesive tape 360 may be attached for the purpose of imparting additional mechanical strength to the device wafer 311 and preventing the device wafer 311 from being separated into individual chips (e.g., in a subsequent dicing process).

Figure 8F:
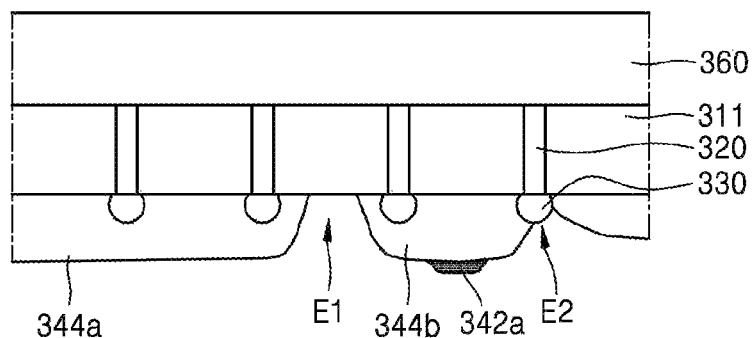

Referring to FIG. 8F, the carrier substrate 350 may be removed. Although the device wafer 311 and the carrier substrate 350 are ideally separated from each other along the silicone release layer 342, when the carrier substrate 350 is removed residues of the silicone adhesive layer 344 and the silicone release layer 342 may actually remain on surfaces of the device substrate 311 and the conductive bump 330. That is, as shown in FIG. 8F, residues 344a, 344b of the silicone adhesive layer may remain on the surfaces of the conductive bump 330 and the device substrate 311. In addition, residues 342a of the silicone release layer may also remain on a surface of some residues 344b of the silicone adhesive layer. However, a portion E1 exposing the device substrate 311 or a portion E2 exposing the conductive bump 330 may be partially present on the surfaces.

Figure 8G:
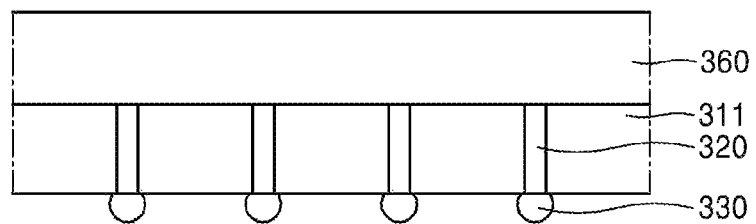

Referring to FIG. 8G, to remove the residues 342a, 344a, 344b, the device substrate 311 may be cleaned by using the composition for removing silicone resins according to the disclosure as set forth above.

Since the composition for removing silicone resins has been described above, additional descriptions thereof are omitted.

The device substrate 311, fabricated as discussed above, may then be subjected to dicing, whereby the individual semiconductor chips 420 may be obtained, and the semiconductor package 400 as described with reference to FIG. 5I may be fabricated by using the semiconductor chips 420.

Hereinafter, embodiments of the present disclosure will be explained in more detail with reference to some examples. It should be understood that these examples are provided for illustration only and are not to be construed in any way as limiting the inventive concept.

Preparation of Composition for Removing Silicone Resins

Compositions for removing silicone resins were prepared according to components and amounts thereof as listed in Table 1 (Examples 1 to 12).

TABLE 1

| Example | Fluorine compound | Amount | Solvent | Amount |
| --- | --- | --- | --- | --- |
| 1 | FC1 | 3 wt % | Piperazine | 97 wt % |
| 2 | FC1 | 3 wt % | 4-methylpyridine | 97 wt % |
| 3 | FC1 | 6 wt % | 4-methylpyridine | 94 wt % |
| 4 | FC1 | 3 wt % | 2-oxazolidinone | 97 wt % |
| 5 | FC1 | 3 wt % | N-ethylmorpholine | 97 wt % |
| 6 | FC1 | 6 wt % | N-ethylmorpholine | 94 wt % |
| 7 | FC1 | 3 wt % | N-ethylpyrrolidone | 97 wt % |
| 8 | FC1 | 6 wt % | N-ethylpyrrolidone | 94 wt % |
| 9 | FC1 | 3 wt % | 1,3-dimethyl-2-imidazolidinone | 97 wt % |
| 10 | FC2 | 3 wt % | N-ethylpyrrolidone | 97 wt % |
| 11 | FC2 | 6 wt % | 4-methylpyridine | 97 wt % |
| 12 | FC2 | 10 wt % | 2-oxazolidinone | 90 wt % |

FC1: Tetrabutylammonium fluoride (TCI Co., Ltd.)
FC2: Tetraethylammonium fluoride (synthesized)

In addition, compositions for removing silicone resins were prepared according to components and amounts thereof as listed in Table 2 (Comparative Examples 1 to 8).

TABLE 2

| Comparative Example | Fluorine compound | Amount | Solvent | Amount |
|---|---|---|---|---|
| 1 | — | — | 1,3-dimethyl-2-imidazolidinone | 100 wt % |
| 2 | — | — | 4-methylpyridine | 100 wt % |
| 3 | — | — | N-ethylpyrrolidone | 100 wt % |
| 4 | — | — | Isopropyl alcohol | 100 wt % |
| 5 | FC1 | 3 wt % | Isopropyl alcohol | 97 wt % |
| 6 | FC1 | 6 wt % | Isopropyl alcohol | 94 wt % |
| 7 | FC2 | 9 wt % | Isopropyl alcohol | 91 wt % |
| 8 | FC1 | 15 wt % | 2-heptanone | 85 wt % |

(Amount: wt %)

All of the solvents used in Examples 1 to 12 and Comparative Examples 1 to 8 were commercially available products obtained from TCI Co., Ltd.

Fabrication of Thin Film Substrate 1

A semiconductor device was formed on a surface of a silicon substrate, followed by forming a layer of a polysiloxane as a silicone release layer. Next, a composition including a siloxane monomer and an initiator was coated as a silicone adhesive layer onto a surface of the silicone release layer, followed by preliminarily curing the silicone adhesive layer at a temperature of 200° C. The sum of the thicknesses of the silicone release layer and the silicone adhesive layer was 80 μm.

Next, a silicon wafer was attached as a carrier substrate onto the silicone adhesive layer, followed by finally curing the silicone adhesive layer at a temperature of 250° C. The silicon substrate was then thinned to a thickness of about 50 μm by using a grinding wheel, followed by attaching a dicing tape to the thinned silicon substrate in order to protect the thinned silicon substrate. Physical force was applied between the silicone release layer and the silicone adhesive layer by using a blade, thereby causing cracks. Next, the silicon substrate and the carrier substrate were separated from each other.

The separated silicon substrate was diced to a size of 2×2 cm², followed by dipping the separated silicon substrate into each of the compositions of Examples 1 to 12 and Comparative Examples 1 to 8, and then rinsed with isopropyl alcohol and dried. When the separated silicon substrate was dipped into each of the compositions for removing silicone resins, the temperature of each composition was adjusted to 25° C., and each composition was stirred at 350 rpm.

Next, film thicknesses of residual silicone resins were measured using a scanning electron microscope (SEM). Results are shown in Tables 3A-3B. In addition, each of the compositions for removing silicone resins was stored at room temperature for 30 days, followed by performing a cleaning experiment of silicone resins in the same method as set forth above. These results are also shown in Tables 3A-3B.

TABLE 3A

| Example | Immediately after preparation | After 30 days storage |
|---|---|---|
| 1 | 6 μm | 7 μm |
| 2 | 0 μm | 0 μm |
| 3 | 0 μm | 0 μm |
| 4 | 15 μm | 10 μm |
| 5 | 12 μm | 16 μm |
| 6 | 0 μm | 0 μm |
| 7 | 0 μm | 0 μm |
| 8 | 0 μm | 0 μm |
| 9 | 0 μm | 0 μm |
| 10 | 0 μm | 0 μm |
| 11 | 0 μm | 2 μm |
| 12 | 1 μm | 0 μm |

TABLE 3B

| Comparative Example | Immediately after preparation | After 30 days storage |
|---|---|---|
| 1 | 75 μm | 77 μm |
| 2 | 71 μm | 78 μm |
| 3 | 73 μm | 73 μm |
| 4 | 64 μm | 76 μm |
| 5 | 53 μm | 58 μm |
| 6 | 48 μm | 47 μm |
| 7 | 55 μm | 56 μm |
| 8 | 35 μm | 55 μm |

As shown in Table 3A, the compositions for removing silicone resins, which were prepared in Examples 1-12 according to the present disclosure, exhibited more outstanding removal performance of silicone resins than the compositions of Comparative Examples 1-8 as shown in Table 3B.

In addition, it could be seen that the compositions of Examples also had storage stability since the compositions of Examples 1-12 exhibited almost equivalent removal performance even after 30 days of storage.

Although most of the compositions of Comparative Examples had storage stability, it was observed that the composition of Comparative Example 8 suffered from slight deterioration in removal performance.

Fabrication of Thin Film Substrate 2

A test was performed in the same manner as in fabrication of thin film substrate 2 except that after the silicone release layer and the silicone adhesive layer were formed on the carrier substrate, the silicon substrate was attached onto the silicone adhesive layer. Results are shown in Tables 4A-4B.

TABLE 4A

| Example | Immediately after preparation | After 30 days storage |
|---|---|---|
| 1 | 10 μm | 10 μm |
| 2 | 0 μm | 0 μm |
| 3 | 0 μm | 0 μm |
| 4 | 29 μm | 28 μm |
| 5 | 25 μm | 33 μm |
| 6 | 0 μm | 0 μm |
| 7 | 0 μm | 0 μm |
| 8 | 0 μm | 0 μm |
| 9 | 0 μm | 0 μm |
| 10 | 0 μm | 0 μm |
| 11 | 2 μm | 7 μm |
| 12 | 2 μm | 0 μm |

TABLE 4B

| Comparative Example | Immediately after preparation | After 30 days storage |
|---|---|---|
| 1 | 77 μm | 77 μm |
| 2 | 71 μm | 75 μm |
| 3 | 74 μm | 76 μm |
| 4 | 73 μm | 76 μm |
| 5 | 71 μm | 77 μm |
| 6 | 58 μm | 55 μm |
| 7 | 65 μm | 69 μm |
| 8 | 60 μm | 65 μm |

As shown in Tables 4A-4B, it could be seen that when the silicone release layer and the silicone adhesive layer were formed on the carrier substrate, the removal rate was deteriorated on the whole as compared with that when the silicone release layer and the silicone adhesive layer were formed on the device substrate.

Silicone Resin Removal Test and Storage Stability

Compositions for removing silicone resins were prepared according to components and amounts thereof as listed in Table 5 (Examples A01 to A10).

TABLE 5

| Example | Fluorine compound | Amount | Solvent | Amount |
|---|---|---|---|---|
| A01 | FC1 | 3 wt % | 4-isopropylpyridine | 97 wt % |
| A02 | FC1 | 3 wt % | N-butylmorpholine | 97 wt % |
| A03 | FC2 | 3 wt % | 4-isopropylpyridine | 97 wt % |
| A04 | FC2 | 3 wt % | N-butylmorpholine | 97 wt % |
| A05 | FC3 | 0.5 wt % | N-ethylmorpholine | 99.5 wt % |
| A06 | FC3 | 3 wt % | 4-methylpyridine | 97 wt % |
| A07 | FC3 | 3 wt % | 2-oxazolidinone | 97 wt % |
| A08 | FC3 | 3 wt % | 4-isopropylpyridine | 97 wt % |
| A09 | FC4 | 3 wt % | 4-isopropylpyridine | 97 wt % |
| A10 | FC4 | 3 wt % | N-butylmorpholine | 97 wt % |

FC1: Tetrabutylammonium fluoride (TCI Co., Ltd.)
FC2: Tetraethylammonium fluoride (synthesized)
FC3: Tetramethylammonium fluoride (TCI Co., Ltd.)
FC4: Tetrapropylammonium fluoride (synthesized)

A cleaning experiment of silicone resins was conducted in the same manner as set forth in "Fabrication of thin film substrate 1" using the compositions for removing silicone resins of Examples A01 to A10 except that each of the compositions for removing silicone resins was stored at room temperature for 90 days. The results are shown in Table 6.

TABLE 6

| Example | Immediately after preparation | After 90 days storage |
|---|---|---|
| A01 | 0 μm | 0 μm |
| A02 | 10 μm | 11 μm |
| A03 | 11 μm | Unmeasurable |
| A04 | 21 μm | Unmeasurable |
| A05 | Unmeasurable | — |
| A06 | Unmeasurable | — |
| A07 | Unmeasurable | — |
| A08 | Unmeasurable | — |
| A09 | 0 μm | 0 μm |
| A10 | 6 μm | 5 μm |

The cleaning experiment of silicone resins could not be performed for the compositions of Examples A05 to A08 because they were precipitated immediately after preparation. The cleaning experiment of silicone resins could not be performed for the compositions of Examples A03 and A04 after 90 days storage for precipitation problem. It could be seen that the fluorine compound having a methyl group (i.e., Examples A05 to A08) did not have storage stability at all. In addition, it turned out that the fluorine compound having an ethyl group (i.e., Examples A03 and A04) had a poor storage stability. In contrast, the compositions of Examples A01 and A02 which include the fluorine compound having a butyl group and the compositions of Examples A09 and A10 which include the fluorine compound having a propyl group showed both storage stability and an excellent silicone resin removal property.

Silicone Resin Removal Test

Compositions for removing silicone resins were prepared according to components and amounts thereof as listed in Table 8 (Examples B1 to B10).

TABLE 7

| Example | Fluorine compound | Amount | Solvent | Amount | Protic Solvent | Amount |
|---|---|---|---|---|---|---|
| B1 | FC1 | 3 wt % | 4-methylpyridine | 97 wt % | None | None |
| B2 | FC1 | 3 wt % | 4-methylpyridine | 96 wt % | IPA | 1 wt % |
| B3 | FC1 | 3 wt % | 4-methylpyridine | 94 wt % | IPA | 3 wt % |
| B4 | FC1 | 3 wt % | 4-methylpyridine | 92 wt % | IPA | 5 wt % |
| B5 | FC1 | 3 wt % | 4-methylpyridine | 90 wt % | IPA | 7 wt % |
| B6 | FC1 | 3 wt % | 4-methylpyridine | 96.5 wt % | Water | 0.5 wt % |
| B7 | FC1 | 3 wt % | 4-methylpyridine | 96 wt % | Water | 1 wt % |
| B8 | FC1 | 3 wt % | 4-methylpyridine | 94 wt % | Water | 3 wt % |
| B9 | FC1 | 3 wt % | 4-methylpyridine | 92 wt % | Water | 5 wt % |
| B10 | FC1 | 3 wt % | 4-methylpyridine | 90 wt % | Water | 7 wt % |

A cleaning experiment of silicone resins was conducted in the same manner as set forth in "Fabrication of thin film substrate 1" using the compositions for removing silicone resins of Examples B1 to B10. The results are shown in Table 8.

TABLE 8

| Example | Immediately after preparation |
|---------|-------------------------------|
| B1 | 0 μm |
| B2 | 4 μm |
| B3 | 11 μm |
| B4 | 51 μm |
| B5 | 106 μm |
| B6 | 0 μm |
| B7 | 5 μm |
| B8 | 13 μm |
| B9 | 48 μm |
| B10 | 135 μm |

As shown in Table 8, inclusion of a protic solvent in the composition degrades the silicon resin removal performance in proportion to the amount of the protic solvent included in the composition. In particular, when the amount of the protic solvent exceeds 5 wt % of the composition, it was found that the silicon resin removal performance was considerably degraded.

While the inventive concept has been particularly shown and described with reference to embodiments thereof, it will be understood that various changes in form and details may be made therein without departing from the spirit and scope of the following claims.

What is claimed is:

1. A composition for removing silicone resins, the composition comprising:
    a heterocyclic solvent; and
    an alkyl ammonium fluoride salt represented by Formula (1):

$(R)_4N^+F^-$  Formula (1)

wherein R is a C3 or C4 linear alkyl group,
    wherein the heterocyclic solvent comprises at least one selected from the group consisting of a pyridine solvent, a morpholine solvent, a piperazine solvent, a urea solvent, and an oxazolidinone solvent, and
    wherein the composition comprises a protic solvent in an amount less than 10% based on a total weight of the compositions, wherein the heterocyclic solvent is present in an amount of about 90 wt % to about 99 wt % based on a total weight of the composition, and wherein the alkyl ammonium fluoride salt represented by Formula (1) is present in an amount of about 0.1 wt % to about 10 wt % based on a total weight of the composition.

2. The composition according to claim 1, wherein the amount of the protic solvent is 3 wt % or less of the composition.

3. The composition according to claim 2, wherein the protic solvent comprises at least one of water and an alcohol.

4. The composition according to claim 1, further comprising:
    a surfactant; and
    a corrosion inhibitor.

5. A composition for removing silicone resins, the composition comprising:
    a heterocyclic solvent; and
    an alkyl ammonium fluoride salt represented by Formula (1):

$(R)_4N^+F^-$  Formula (1)

wherein R is a C3 or C4 linear alkyl group;
    wherein the alkyl ammonium fluoride salt is present in an amount of about 0.1 wt % to about 10 wt % based on a total weight of the composition,
    wherein the heterocyclic solvent has a 4- to 8-membered ring;
    wherein the heterocyclic solvent is at least one selected from the group consisting of a nitrogen-containing and oxygen-containing heterocyclic solvent; and
    wherein the heterocyclic solvent is present in an amount of about 70 wt % to about 99.9 wt % based on a total weight of the composition.

6. The composition according to claim 5, wherein the heterocyclic solvent comprises at least one selected from the group consisting of a pyridine solvent, a morpholine solvent, a piperazine solvent, a urea solvent, and an oxazolidinone solvent.

7. The composition according to claim 5, wherein the composition comprises a protic solvent in an amount of 3 wt % or less of the composition.

8. The composition according to claim 5, wherein the composition comprises any one of water and alcohol in an amount of 3 wt % or less of the composition.

9. A system for temporarily bonding a target substrate to a carrier substrate to facilitate processing of the target substrate, the system comprising:
    a carrier substrate;
    a silicone binder configured to bond the carrier substrate to the target substrate;
    a separation apparatus configured to separate the carrier substrate and the target substrate from one another such that a residue of the silicone binder remains on the target substrate; and
    a composition configured to remove the residue, wherein the composition comprises a heterocyclic solvent and an alkyl ammonium fluoride salt represented by Formula (1):

$(R)_4N^+F^-$  Formula (1)

wherein R is a C3 or C4 linear alkyl group,
    wherein the heterocyclic solvent comprises at least one selected from the group consisting of a pyridine solvent, a morpholine solvent, a piperazine solvent, a urea solvent, and an oxazolidinone solvent, and
    wherein the composition comprises a protic solvent in an amount of 3 wt % of less based on a total weight of the composition, wherein the heterocyclic solvent is present in an amount of about 90 wt % to about 99 wt % based on a total weight of the composition, and wherein the alkyl ammonium fluoride salt represented by Formula (1) is present in an amount of about 0.1 wt % to about 10 wt % based on a total weight of the composition.

10. The system of claim 9, wherein the silicone binder comprises:
    a silicone release layer configured to contact the target substrate; and
    a silicone adhesive layer disposed on the silicone release layer and contacting the carrier substrate.

11. The composition according to claim 1, wherein the heterocyclic solvent comprises a pyridine solvent represented by Formula (2):

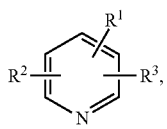

Formula (2)

wherein each of $R^1$, $R^2$, and $R^3$ are independently a hydrogen, a halogen element, a C1 to C22 branched or non-branched alkyl group, a C1 to C10 alkoxy group, a C2 to C22 branched or non-branched alkenyl group, a C1 to C20 alkylamino group, a C6 to C20 aryl or alkylaryl group, a C7 to C20 arylalkyl group, a C5 to C12 cycloalkyl group, an aldehyde group, an acetaldehyde group, a cyanide group, or a methyl sulfide group.

12. The composition according to claim 1, wherein the heterocyclic solvent comprises at least one selected from the group consisting of 2-methylpyridine, 3-methylpyridine, 4-methylpyridine, 4-ethylpyridine, 4-propylpyridine, 4-isopropylpyridine, 4-amylpyridine, 2,3-lutidine, 2,4-lutidine, 2,5-lutidine, 3,4-lutidine, 3,5-lutidine, and 2,4,6-trimethylpyridine.

13. The composition according to claim 1, wherein the heterocyclic solvent comprises a morpholine solvent represented by Formula (3):

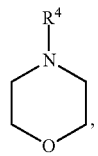

Formula (3)

wherein $R^4$ is a hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group.

14. The composition according to claim 13, wherein $R^4$ is a phenyl group substituted with a C1 to C4 aliphatic hydrocarbon, a halogen element, a cyanide group, or an aldehyde group; or $R^4$ is a pyridine group substituted with a C1 to C4 aliphatic hydrocarbon, a halogen element, a cyanide group, or an aldehyde group.

15. The composition according to claim 1, wherein the heterocyclic solvent comprises a piperazine solvent represented by Formula (4):

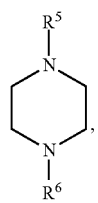

Formula (4)

wherein each of $R^5$ and $R^6$ is a hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group.

16. The composition according to claim 15, wherein $R^5$ or $R^6$ is a phenyl group substituted with a C1 to C4 aliphatic hydrocarbon, a halogen element, a cyanide group, or an aldehyde group; or $R^5$ or $R^6$ is a pyridine group substituted with a C1 to C4 aliphatic hydrocarbon, a halogen element, a cyanide group, or an aldehyde group.

17. The composition according to claim 1, wherein the heterocyclic solvent comprises a pyrrolidone solvent represented by Formula (5):

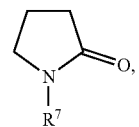

Formula (5)

wherein $R^7$ is a hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group.

18. The composition according to claim 1, wherein the heterocyclic solvent comprises a urea solvent represented by Formula (6):

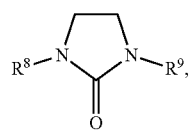

Formula (6)

wherein each of $R^8$ and $R^9$ is a hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group.

19. The composition according to claim 1, wherein the heterocyclic solvent comprises a oxazolidinone solvent represented by Formula (7):

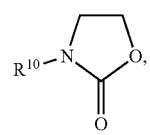

Formula (7)

wherein $R^{10}$ is a hydrogen, a halogen element, a C1 to C6 branched or non-branched alkyl group, a C1 to C6 alkoxy group, a C2 to C6 branched or non-branched alkenyl group, a C1 to C6 alkylamino group, a C6 to C15 aryl or alkylaryl group, a C7 to C15 arylalkyl group, a C5 to C10 cycloalkyl group, an aldehyde group, an acetaldehyde group, a cyanide group, or a methyl sulfide group.

20. The composition according to claim 5, wherein the composition comprises alcohol in an amount of 3 wt% or less of the composition.

* * * * *